(12) United States Patent
Hsueh et al.

(10) Patent No.: US 10,996,553 B2
(45) Date of Patent: May 4, 2021

(54) EXTREME ULTRAVIOLET MASK WITH REDUCED WAFER NEIGHBORING EFFECT AND METHOD OF MANUFACTURING THE SAME

(71) Applicant: Taiwan Semiconductor Manufacturing Co., Ltd., Hsinchu (TW)

(72) Inventors: Wen-Chang Hsueh, Taoyuan (TW); Huan-Ling Lee, Hsinchu County (TW); Chia-Jen Chen, Jhudong Township, Hsinchu County (TW); Hsin-Chang Lee, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 218 days.

(21) Appl. No.: 16/128,863

(22) Filed: Sep. 12, 2018

(65) Prior Publication Data
US 2019/0146325 A1    May 16, 2019

Related U.S. Application Data

(60) Provisional application No. 62/585,657, filed on Nov. 14, 2017.

(51) Int. Cl.
*G03F 1/22* (2012.01)
*G03F 1/24* (2012.01)
*G03F 1/58* (2012.01)
*G03F 1/48* (2012.01)
(Continued)

(52) U.S. Cl.
CPC ............... *G03F 1/22* (2013.01); *G03F 1/24* (2013.01); *G03F 1/48* (2013.01); *G03F 1/52* (2013.01); *G03F 1/58* (2013.01); *H01L 21/0274* (2013.01)

(58) Field of Classification Search
CPC ..... G03F 1/58; G03F 1/48; G03F 1/52; G03F 1/22; G03F 1/24; H01L 21/0274
See application file for complete search history.

(56) References Cited

U.S. PATENT DOCUMENTS

| 8,764,995 B2 | 7/2014 | Chang et al. |
| 8,796,666 B1 | 8/2014 | Huang et al. |
| 8,828,625 B2 | 9/2014 | Lu et al. |

(Continued)

*Primary Examiner* — Martin J Angebranndt
(74) *Attorney, Agent, or Firm* — Birch, Stewart, Kolasch & Birch LLP

(57) ABSTRACT

A reticle and a method for manufacturing the same are provided. The reticle includes a mask substrate, a reflective multilayer (ML), a capping layer and an absorption composite structure. The reflective ML is positioned over a front-side surface of the mask substrate. The capping layer is positioned over the reflective ML. The absorption composite structure is positioned over the capping layer. The absorption composite structure includes a first absorption layer, a second absorption layer, a third absorption layer and an etch stop layer. The first absorption layer is positioned over the capping layer. The second absorption layer is positioned over the first absorption layer. The third absorption layer is positioned over the second absorption layer. The etch stop layer is positioned between the first absorption layer and the second absorption layer. The first absorption layer and the second absorption layer are made of the same material.

20 Claims, 19 Drawing Sheets

(51) Int. Cl.
*G03F 1/52* (2012.01)
*H01L 21/027* (2006.01)

(56) References Cited

U.S. PATENT DOCUMENTS

| | | |
|---|---|---|
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2002/0076625 A1* | 6/2002 | Shoki ............ B82Y 10/00 430/5 |
| 2003/0031937 A1* | 2/2003 | Yan ............ G03F 1/24 430/5 |
| 2004/0002009 A1* | 1/2004 | Yan ............ G21K 1/062 430/5 |
| 2004/0091789 A1* | 5/2004 | Han ............ G03F 1/24 430/5 |
| 2005/0084768 A1* | 4/2005 | Han ............ B82Y 10/00 430/5 |
| 2005/0282072 A1* | 12/2005 | Hector ............ G03F 1/34 430/5 |
| 2006/0240334 A1* | 10/2006 | Huh ............ B82Y 10/00 430/5 |
| 2009/0017387 A1* | 1/2009 | Shoki ............ B82Y 10/00 430/5 |
| 2010/0323280 A1* | 12/2010 | Jeong ............ B82Y 10/00 430/5 |
| 2011/0027703 A1* | 2/2011 | Shoki ............ G03F 1/24 430/5 |
| 2013/0092655 A1* | 4/2013 | Yu ............ B82Y 40/00 216/41 |
| 2014/0234756 A1* | 8/2014 | Kinoshita ............ G03F 1/24 430/5 |
| 2014/0254001 A1* | 9/2014 | Sun ............ G02B 5/288 359/360 |
| 2014/0254018 A1* | 9/2014 | Sun ............ G03F 1/24 359/599 |
| 2015/0024305 A1* | 1/2015 | Lu ............ G03F 1/24 430/5 |
| 2018/0031965 A1* | 2/2018 | Jindal ............ G03F 1/60 |
| 2018/0356719 A1* | 12/2018 | Ikebe ............ G03F 1/24 |

* cited by examiner

EXTREME ULTRAVIOLET MASK WITH REDUCED WAFER NEIGHBORING EFFECT AND METHOD OF MANUFACTURING THE SAME

CROSS REFERENCE TO RELATED APPLICATIONS

This application claims the benefit of U.S. Provisional Application No. 62/585,657 filed Nov. 14, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

In one example associated with lithography patterning, a photomask (or mask) for use in a lithography process is defined with the circuit pattern that will be transferred to the wafers. In advanced lithography technologies, an extreme ultraviolet (EUV) lithography process is used along with a reflective mask. It is important that the EUV mask be as clean and defect-free as possible.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
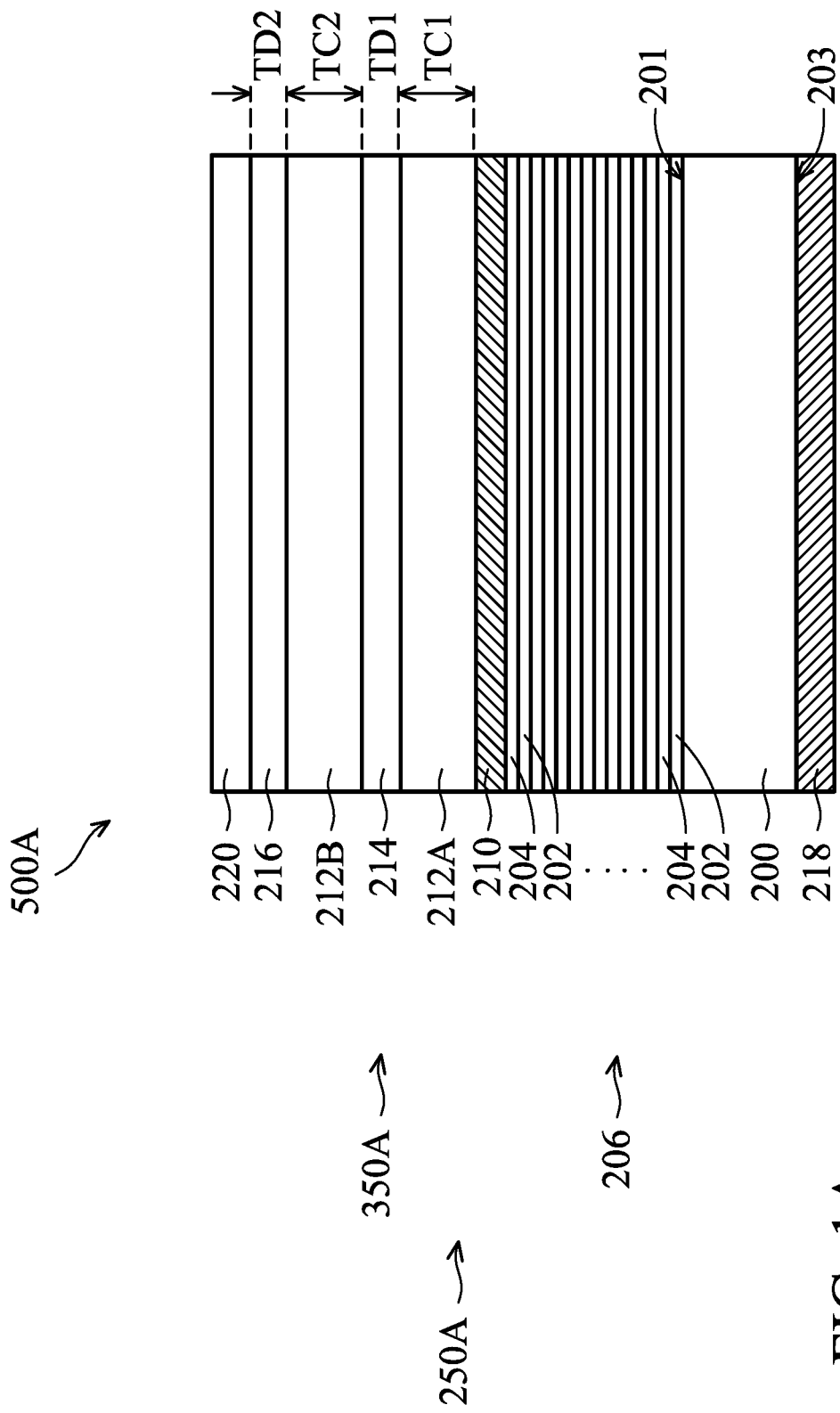
FIGS. 1A-1F are cross-sectional views of various stages of a process for manufacturing a reticle, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The advanced lithography process, method, and materials described in the current disclosure can be used in many applications, including fin-type field effect transistors (FinFETs). For example, the fins may be patterned to produce relatively close spacing between features, for which the above disclosure is well suited. In addition, spacers used in forming fins of FinFETs can be processed according to the above disclosure.

FIGS. 1A-1F are cross-sectional views of various stages of a process for manufacturing a reticle 500A, in accordance with some embodiments. In some embodiments, the reticle 500A is an extreme ultraviolet (EUV) reticle. The EUV lithography process utilizes a reflective reticle rather than a transmissive reticle. The EUV lithography process utilizes EUV scanners that emit light in the extreme ultraviolet (EUV) region, which is light having an extreme ultraviolet wavelength, such as 10-15 nm. In some embodiments, the EUV source generates EUV with wavelength at about 13.6 nm. Some EUV scanners may use reflective optics, i.e. mirrors and work in the vacuum environment. EUV scanners may provide the desired pattern on an absorption layer (e.g. an "EUV" reticle absorber) formed on a reflective reticle. Within the EUV range, all materials are highly absorbing. Thus, reflective optics rather than refractive optics are used.

In some embodiments, the process for manufacturing a reticle 500A includes a blank reticle fabrication process and a reticle patterning process. During the blank reticle fabrication process, a blank reticle is formed by depositing suitable layers (e.g. a reflective multilayer, a capping layer and an absorption layer) on a suitable substrate. The blank reticle is patterned during the reticle patterning process to have a design of a layer of an integrated circuit (IC). The patterned reticle is then used to transfer circuit patterns (e.g. the design of a layer of an IC) onto a semiconductor wafer. The patterns on the reticle can be transferred over and over onto multiple wafers through various lithography processes. Several reticles (for example, a set of 15 to 30 reticles) may be used to construct a complete IC. In general, various reticles are fabricated for use in various lithography processes. Types of EUV reticles may include the binary intensity mask (BIM) type and the phase-shifting mask (PSM) type.

As shown in FIG. 1A, a mask substrate 200 is received. The mask substrate 200 of the blank reticle 250A may have a front-side surface 201 and a back-side surface 203 opposite to the front-side surface 201. The mask substrate 200 may be made of a suitable material, such as a low thermal expansion material (LTEM) or fused quartz. In some embodiments, the LTEM includes $TiO_2$ doped $SiO_2$, or another suitable material with low thermal expansion. The mask substrate 200 may serve to minimize image distortion due to mask heating. In addition, the mask substrate 200 may include materials with a low defect level and a smooth surface.

As shown in FIG. 1A, a conductive layer 218 is formed over the back-side surface 203 of the mask substrate 200 opposite to the front-side surface 201 of the mask substrate 200. The conductive layer 218 may be positioned under on the back-side surface 203 of the mask substrate 200 for the electrostatic chucking purpose. In some embodiments, the conductive layer 218 includes tantalum boron (TaB) or chromium nitride (CrN), though other suitable compositions are possible.

As shown in FIG. 1A, the first reflective multilayer (ML) 206 is formed over the front-side surface 201 of the mask substrate 200 by a deposition process. In accordance with the Fresnel equations, light reflection occurs when light propagates across an interface between two materials of different refractive indices. The greater the difference between the refractive indices of layers, the higher the intensity of the reflected light becomes as it propagates across the layers. To increase the intensity of the reflected light, in some embodiments, a multilayer of alternating materials may be used to increase the number of interfaces so as to cause the light reflected from each of the different interfaces to interfere constructively. In some embodiments, the first reflective ML 206 includes a plurality of film pairs (e.g. a first layer 202 above or below a second layer 204 in each film pair), such as molybdenum-silicon (Mo/Si) film pairs. In some other embodiments, the first reflective ML 206 may include molybdenum-beryllium (Mo/Be) film pairs, or other suitable materials that are configurable to reflect the EUV light. The characteristics of the first reflective ML 206 are selected such that it provides a high reflectivity to a selected electromagnetic radiation type/wavelength. For example, for the purpose of EUV lithography, the first reflective ML 206 may be designed to reflect light within the EUV range. The thickness of each layer of the first reflective ML 206 depends on the EUV wavelength and the incident angle. Particularly, the thickness of the first reflective ML 206 (and the thicknesses of the film pairs) may be adjusted to achieve the maximum constructive interference of the EUV light diffracted at each interface and a minimum absorption of the EUV light. In some embodiments, the number of the film pairs in the first reflective ML 206 may be in a range from about twenty to about eighty. However, any number of film pairs may be used. For example, the first reflective ML 206 may include forty pairs of layers of Mo/Si. For example, each Mo/Si film pair has a thickness (e.g., the thickness TA) of about 7 nm and the first reflective ML 206 has a total thickness of 280 nm. For example, the first layer 202 (e.g., a Si layer) in each Mo/Si film pair may have a thickness T1 of about 4 nm. In addition, the second layer 204 (e.g., a Mo layer) in each Mo/Si film pair may have a thickness T2 of about 3 nm. In this case, a reflectivity of about 70% is achieved.

In some embodiments, the first reflective ML 206 may be formed by various deposition processes. Examples of the deposition processes include a physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and other methods known in the art. The MOD is a deposition technique using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to their constituent metal elements.

Afterwards, a capping layer 210 is formed over the first reflective ML 206. The capping layer 210 is configured to be transparent to EUV light and to protect the first reflective ML 206 from damage and/or oxidation. In addition, the capping layer 210 may serve as an etch stop layer in a patterning or repairing/cleaning process of the absorption structure 212 over the capping layer 210. The capping layer 210 may have different etching characteristics from the absorption layer.

In some embodiments, the capping layer 210 is formed of ruthenium (Ru), Ru compounds such as RuB, RuSi, RuN or RuON, chromium (Cr), Cr oxide, and Cr nitride. boron (B), boron nitride and boron carbide. For example, the processes of the mask substrate 200, the capping layer 210 may be similar to, or the same as, those of the first reflective ML 206, and the details thereof are not repeated herein. For example, a low-temperature deposition process is often chosen for the capping layer 210 to prevent inter-diffusion of the first reflective ML 206. For example, the thickness of the capping layer 210 may be in a range from about 2 nm to about 5 nm.

Afterwards, an absorption layer 212A is deposited over the capping layer 210. The absorption structure 212 is used to form the desired exposure pattern onto the front-side surface 201 of the reticle 250A. In some embodiments, the absorption layer 212A is an absorption material to absorb radiation in the EUV wavelength range projected onto the pattern portion 410 of the reticle 250A. For example, the reticle 250A can be referred to as a Binary Intensity Reticle (BIM). In some embodiments, the absorption layer 212A may be patterned according to an IC layout pattern (or simply IC pattern).

In some embodiments, the absorption layer 212A is formed of Ta-based materials. In some embodiments, the absorption layer 212A may be formed of tantalum boron nitride (TaBN). For example, the absorption layer 212A may include multiple film layers with each film containing chromium, chromium oxide, chromium nitride, titanium, titanium oxide, titanium nitride, tantalum, tantalum oxide, tantalum nitride, tantalum oxynitride, tantalum boron oxide, tantalum boron oxynitride, aluminum, aluminum-copper, aluminum oxide, silver, silver oxide, palladium, ruthenium, molybdenum, other suitable materials, and/or mixture of some of the above. For example, the processes of the absorption layer 212A may be similar to, or the same as, those of the capping layer 210 and the first reflective ML 206, and the details thereof are not repeated herein. For example, the thickness TC1 of the absorption layer 212A may be in a range from about 1 nm to about 70 nm.

Afterwards, an etch stop layer 214 is deposited over the absorption layer 212A. The etch stop layer 214 may be used as a stop layer for an etching process performed on the subsequent absorption layer (e.g., an absorption layer 212B) formed thereon.

In some embodiments, the etch stop layer 214 and the absorption layer 212A are made of different materials. In some embodiments, the etch stop layer 214 includes tantalum, aluminum, ruthenium, nickel, chromium, an oxide thereof, a nitride thereof, a boride thereof, or a combination thereof. For example, the etch stop layer 214 may include tantalum boron oxide (TaBO). For example, the processes of the etch stop layer 214 may be similar to, or the same as, those of the capping layer 210, the first reflective ML 206 and the absorption layer 212A, and the details thereof are not repeated herein. For example, the thickness TD1 of the etch stop layer 214 may be in a range from about 1 nm to about 30 nm. For example, the thickness TD1 of the etch stop layer 214 may be in a range from about 3 nm to about 5 nm.

Afterwards, an absorption layer 212B is formed over the absorption layer 212A. In addition, the etch stop layer 214 is positioned between the absorption layer 212A and the absorption layer 212B. In some embodiments, the absorption layer 212A and the absorption layer 212B are made of the same material. In addition, the etch stop layer 214 and the absorption layer 212B may be made of different materials.

For example, the materials, configurations, structures and/or processes of the absorption layer 212B may be similar to, or the same as, those of the absorption layer 212A, and the details thereof are not repeated herein. In some embodiments, the thickness TC2 of the absorption layer 212B may be the same as or different to the thickness TC1 of the absorption layer 212A. For example, the thickness TC2 of the absorption layer 212B may be in a range from about 1 nm to about 70 nm.

Afterwards, an absorption layer 216 is formed over the absorption layer 212B. In some embodiments, the absorption layer 216 and the etch stop layer 214 are made of the same material. In addition, the absorption layer 216 and the absorption layer 212B may be made of different materials.

For example, the materials, configurations, structures and/or processes of the absorption layer 216 may be similar to, or the same as, those of the etch stop layer 214, and the details thereof are not repeated herein. In some embodiments, the thickness TD2 of the absorption layer 216 may be the same as or different to the thickness TD1 of the etch stop layer 214. For example, the thickness TD2 of the absorption layer 216 may be greater the thickness TD1 of the etch stop layer 214. For example, the thickness TD2 of the absorption layer 216 may be in a range from about 1 nm to about 30 nm.

In some embodiments, the absorption layer 212A, the etch stop layer 214, the absorption layer 212B and the absorption layer 216 collectively serve as an absorption composite structure 350A. Because the absorption layer 212A and the absorption layer 212B may be formed of a first absorption material, such as TaBN, the etch stop layer 214 and the absorption layer 216 may be formed of a second absorption material (e.g., TaBO) that is different form the first material. Therefore, the absorption composite structure 350A may include a first absorption film pair (e.g., the absorption layer 212A and the etch stop layer 214) and a second absorption film pair (e.g., the absorption layer 212B and the absorption layer 216). The first absorption film pair is positioned over the capping layer 210. In addition, the second absorption film pair is positioned over the first absorption film pair.

After performing the aforementioned blank reticle fabrication processes, the blank reticle 250A is formed, as shown in FIG. 1A in accordance with some embodiments. In some embodiments, the blank reticle 250A is an extreme ultraviolet (EUV) blank reticle. The blank reticle 250A may include the mask substrate 200, the first reflective ML 206, the capping layer 210 and the absorption composite structure 350A. In addition, the absorption composite structure 350A may include the absorption layer 212A, the etch stop layer 214, the absorption layer 212B and the absorption layer 216, from bottom to top.

Afterwards, a hard mask layer 220 is formed over the absorption layer 216 of the blank reticle 250A, as shown in FIG. 1A in accordance with some embodiments. In some embodiments, the hard mask layer 220 is formed of silicon oxide, silicon nitride, silicon oxynitride, silicon carbide, metal oxide, metal nitride or metal oxynitride, another suitable material, or a combination thereof. For example, the hard mask layer 220 may be formed of tantalum boron nitride (TaBN), chromium oxynitride ($Cr_xO_yN_z$), aluminum oxynitride ($Al_xO_yN_z$), or a combination thereof. The hard mask layer 220 may be formed by a deposition process including a chemical vapor deposition (CVD) process, a physical vapor deposition (PVD) process, an atomic layer deposition (ALD) process and/or another suitable process.

Figure 1B:
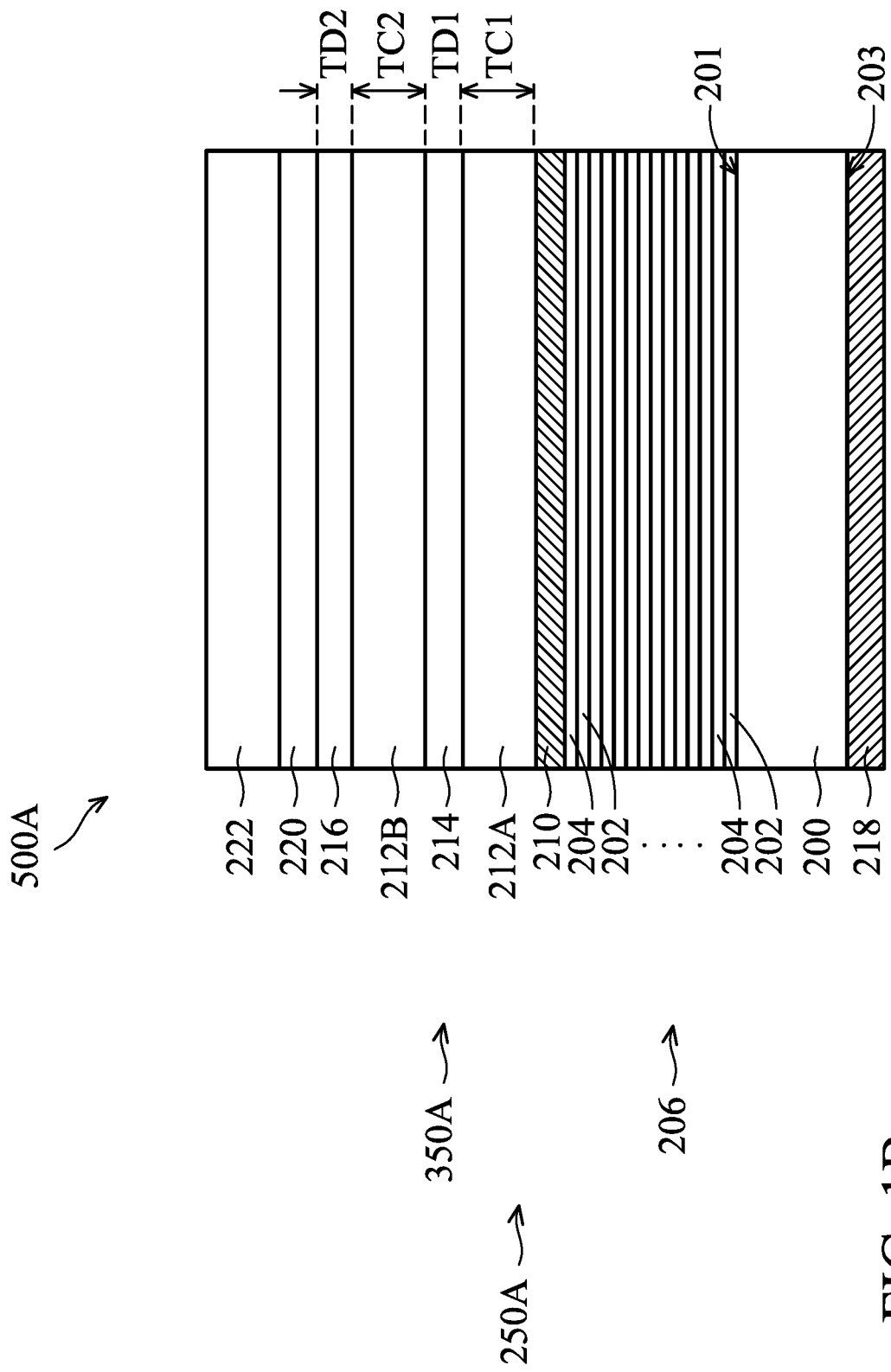

Afterwards, a photoresist layer 222 is formed over the capping layer 210 of the blank reticle 250A, as shown in FIG. 1B in accordance with some embodiments. The photoresist layer 222 may include a positive photoresist layer and may be formed by a spin-on coating process followed by a soft baking process.

Figure 1C:
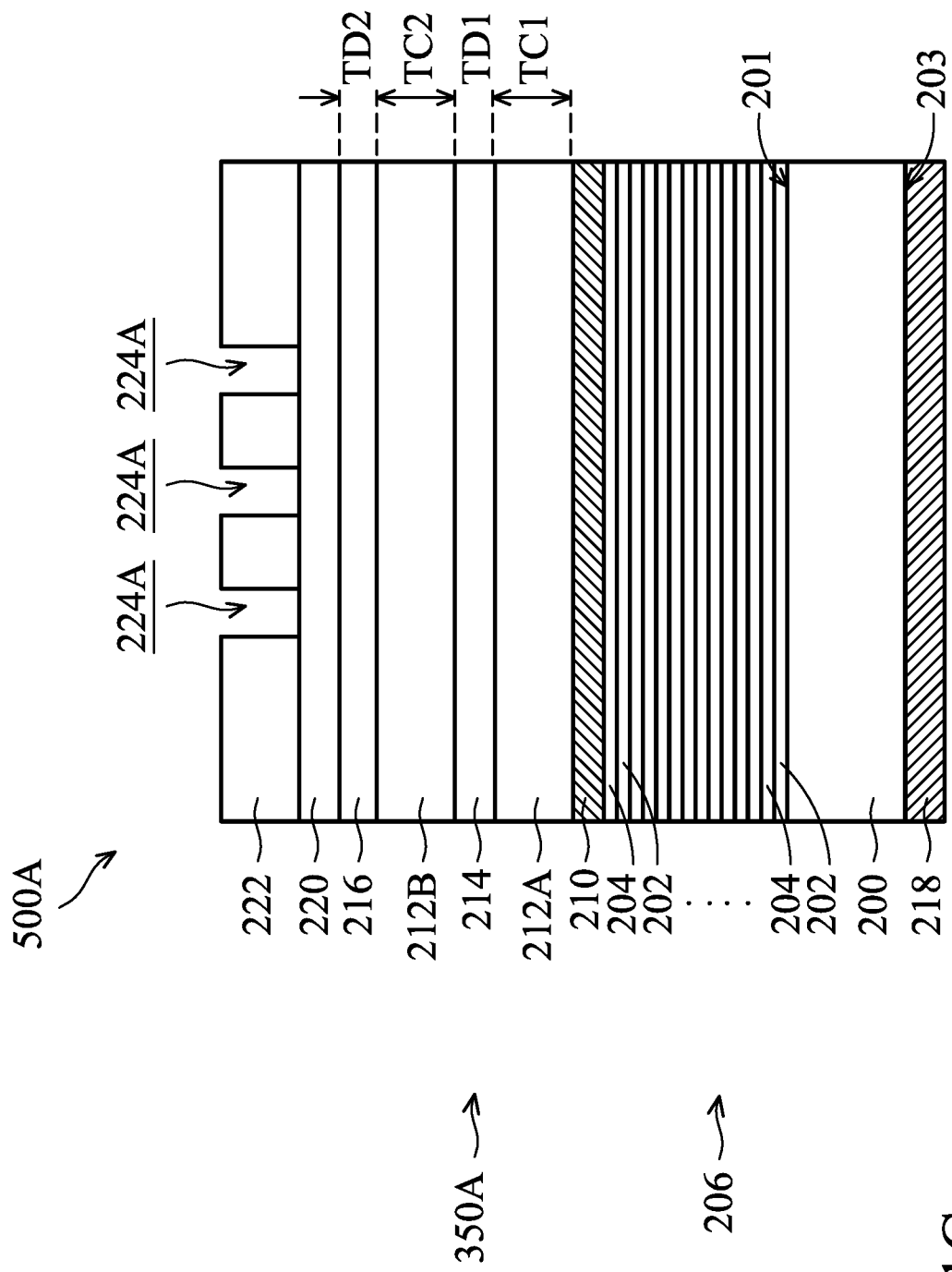

Afterwards, the photoresist layer 222 is patterned to form photoresist patterns 222A on the hard mask layer 220 by a patterning process, as shown in FIG. 1C in accordance with some embodiments. In some embodiments, the patterning process includes a photolithography process. The photolithography process is configured to form openings 224A in the photoresist layer 222 (FIG. 1B). The openings 224A are formed passing through the photoresist layer 222 to expose the hard mask layer 220. In some embodiments, the photolithography process includes exposure, post-exposure baking, developing, rinsing, drying (e.g. hard baking), other suitable processes, and/or combinations thereof to form the photoresist patterns 222A. For example, electron, ion, or photon beam direct writing may be used for the exposure step in the mask patterning process.

Figure 1D:
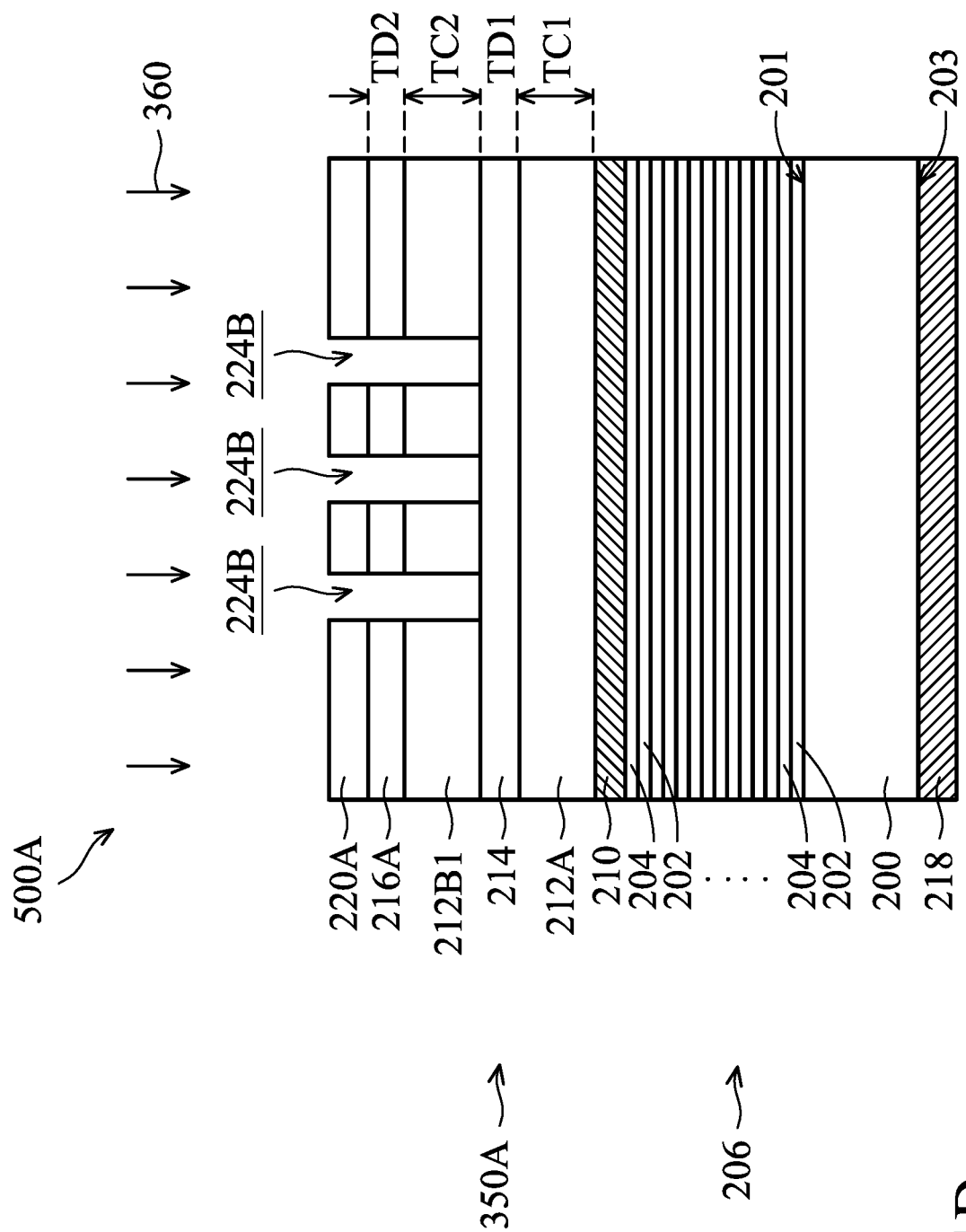

Afterwards, a portion of the hard mask layer 220 (FIG. 1C) that is not covered by the photoresist patterns 222A are removed by an etching process, as shown in FIG. 1D in accordance with some embodiments. The etching process may stop on the absorption layer 216 to form openings 232B in the hard mask layer 220 (FIG. 1B). The openings may be formed passing through the hard mask layer 220 to expose the absorption layer 216. In addition, the hard mask layer 220 (FIG. 1C) is patterned to form hard mask patterns 220A shown in FIG. 1D. In some embodiments, the etching process includes a dry etching process performed using halogen-based gas mixing with $O_2$, $N_2$, ON and $H_2O$ and a carrier gas such as He or Ar or mixtures thereof, to remove the uncovered portion of the hard mask layer 220. The halogen-based gas may include $Cl_2$, $CHF_3$, $CH_3F$, $C4F_8$, $CF_4$, $SF_6$, $CF_3Cl$, or a mixture thereof. In some embodiments, the etching process includes using $Cl_2$ and $O_2$. In some embodiments, the etching process includes using $CF_3Cl$ and $O_2$.

After performing the etching processes of the hard mask layer 220, the thickness of the photoresist patterns 222A (FIG. 1C) may be removed simultaneously. For example, the photoresist patterns 222A may be removed by a wet etching process or other applicable processes after performing the etching processes of the hard mask layer 220. The wet etching process, for example, a photoresist stripping process, may use a photoresist stripper, an aqueous alkaline solution, an amine-solvent mixture, or an organic solvent.

Afterwards, a first patterning process 360 is performed to remove portions of the absorption layer 216 and the underlying absorption layer 212B (FIG. 1C) until the etch stop layer 214 is exposed, as shown in FIG. 1D in accordance with some embodiments. The portions of the absorption layer 216 and the underlying absorption layer 212B that are not covered by the hard mask patterns 220A may be removed by the first patterning process 360. The first patterning process 360 may be performed to form openings 224B passing through the absorption layer 216 and the underlying absorption layer 212B. In addition, the first patterning process 360 may stop on the etch stop layer 214 due to the etching selectivity between the absorption layer 212B and the etch stop layer 214. Therefore, the absorption layer 216 is patterned to form a patterned absorption layer 216A. The absorption layer 212B is patterned to form a patterned absorption layer 212B1 shown in FIG. 1D.

In some embodiments, the first patterning process 360 includes a dry etching process. In some embodiments, the first patterning process 360 is performed using an etching gas including chlorine ($Cl_2$), fluorine ($F_2$), carbon (C), oxygen ($O_2$), nitrogen ($N_2$). $SF_6$, $CH_3Cl$, $CH_2Cl_2$, $CF_3Cl$ or a mixture thereof. In some embodiments, the first patterning process 360 includes using $Cl_2$ and $O_2$. In some embodiments, the first patterning process 360 includes using $CF_3Cl$ and $O_2$. For example, the first patterning process 360 may use the etching gas including fluorine ($F_2$) to remove the absorption layer 216 formed of TaBO. In addition, the first patterning process 360 may use the etching gas chlorine ($Cl_2$) to remove the absorption layer 212B formed of TaBN.

Figure 1E:
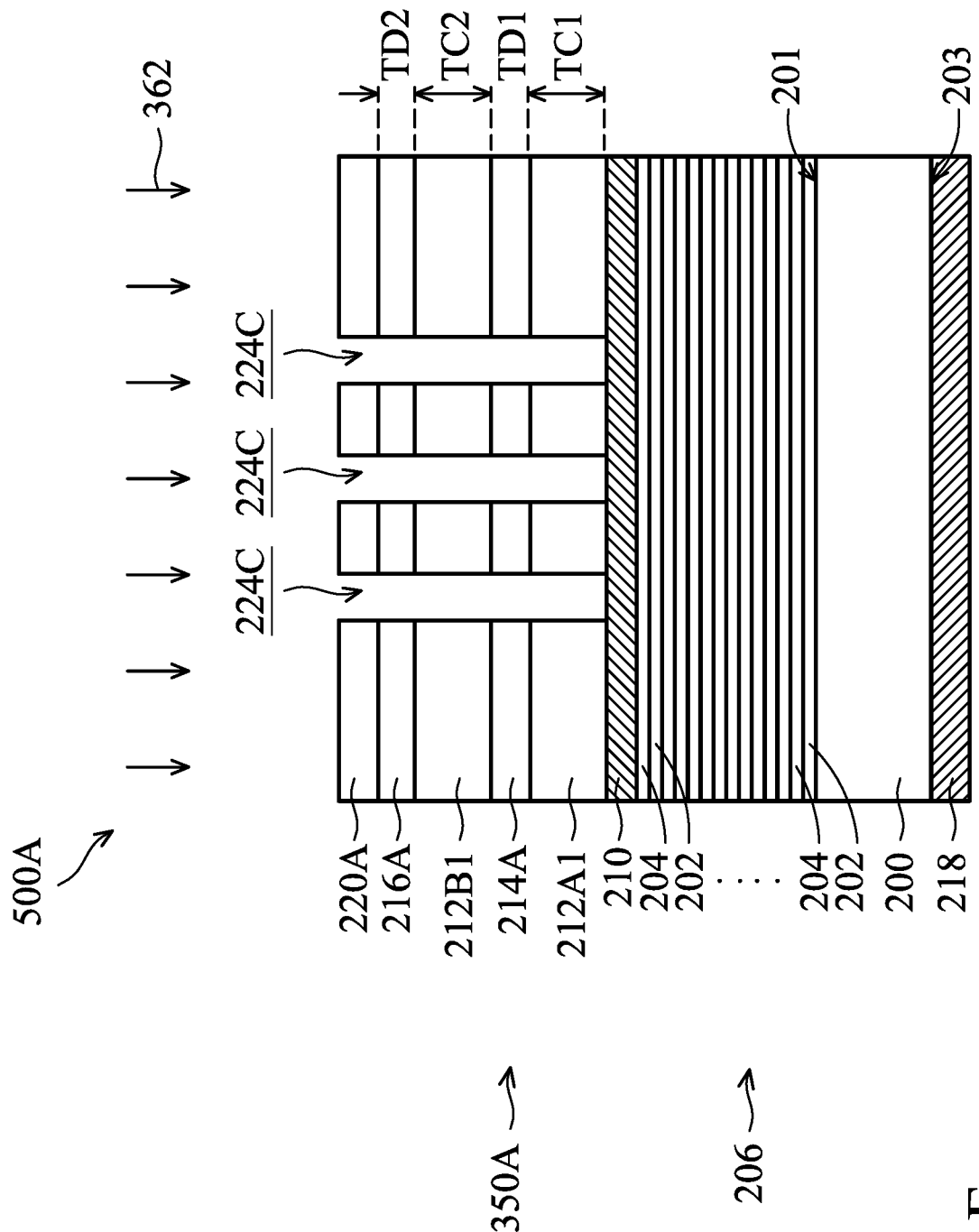

Afterwards, a second patterning process 362 is performed to remove portions of the etch stop layer 214 and the absorption layer 212A (FIG. 1D) until the capping layer 210 is exposed, as shown in FIG. 1E in accordance with some embodiments. The portions of the etch stop layer 214 and the underlying absorption layer 212A that are not covered by the hard mask patterns 220A may be removed by the second patterning process 362. The second patterning process 362 may be performed to form openings 224C passing through the etch stop layer 214 and the underlying absorption layer 212A. In addition, the second patterning process 362 may stop on the capping layer 210 due to the etching selectivity between the absorption layer 212A and the capping layer 210. Therefore, the etch stop layer 214 is patterned to form a patterned etch stop layer 214A. The absorption layer 212A is patterned to form a patterned absorption layer 212A1 shown in FIG. 1E.

In some embodiments, the second patterning process 362 includes a dry etching process. In some embodiments, the second patterning process 362 is performed using an etching gas including chlorine ($Cl_2$), fluorine ($F_2$), carbon (C), oxygen ($O_2$), nitrogen ($N_2$). $SF_6$, $CH_3Cl$, $CH_2Cl_2$ or a mixture thereof. In some embodiments, the second patterning process 362 includes using $Cl_2$ and $O_2$. In some embodiments, the second patterning process 362 includes using $CH_3Cl$ and $O_2$. In some embodiments, the second patterning process 362 includes using $CH_2Cl_2$ and $O_2$. For example, the second patterning process 362 may use the etching gas including fluorine ($F_2$) to remove the etch stop layer 214 formed of TaBO. In addition, the second patterning process 362 may use the etching gas chlorine ($Cl_2$) to remove the absorption layer 212A formed of TaBN.

Figure 1F:
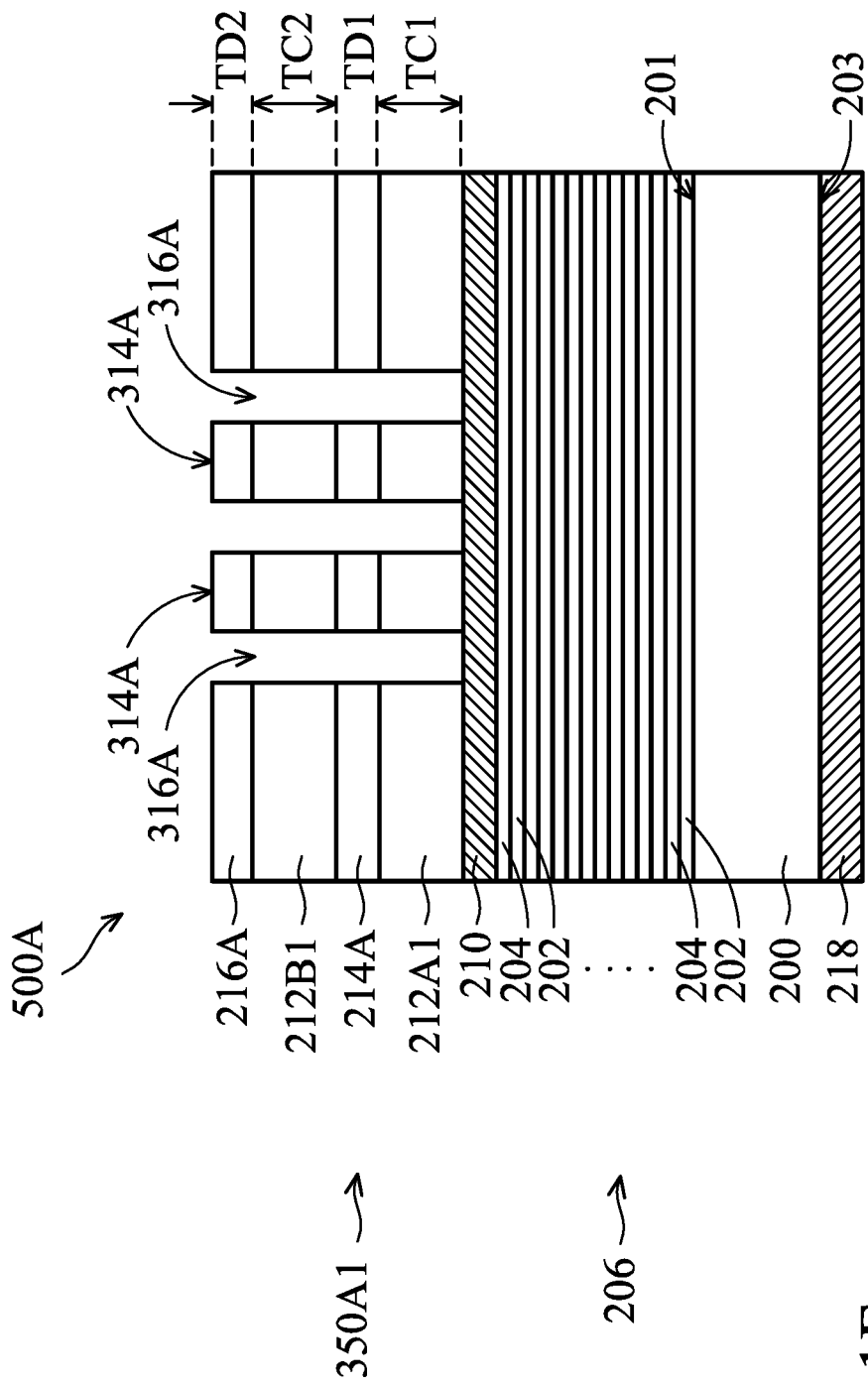

After the second patterning process 362 is performed, the hard mask patterns 220A are removed after performing the second patterning process 362 by an etching process, as shown in FIG. 1F in accordance with some embodiments. After hard mask patterns 220A are removed, the patterned absorption layer 212A1, the patterned etch stop layer 214A, the patterned absorption layer 212B1 and the patterned absorption layer 216A may collectively form a patterned absorption composite structure 350A1 on a portion of the capping layer 210.

In some embodiments, the etching process of the hard mask patterns 220A includes a plasma etching process. In some embodiments, the plasma etching process is performed using an etching gas including chlorine ($Cl_2$) oxygen ($O_2$) or a mixture thereof. For example, the etching gas may include $Cl_2$, $CHF_3$, $CH_3F$, $C4F_8$, $CF_4$, $SF_6$, $CF_3Cl$, $SF_6$, $Cl_2$, $CH_3Cl$, $CF_4$, $CH_2Cl_2$, $O_2$, $H_2O$, or a mixture thereof.

After performing the aforementioned processes, the reticle 500A is formed, as shown in FIG. 1F in accordance with some embodiments. For example, the reticle 500A may have opaque regions 314A and reflective regions 316A adjacent to the opaque regions 314A. In the opaque regions 314A, the patterned absorption composite structure 350A1 may remain on the reticle 500A. An incident light is almost fully absorbed by the patterned absorption composite structure 350A1. In the reflective regions 316A, the absorption composite structure 350A (FIG. 1A) may be removed and the incident light is reflected by the underlying first reflective ML 206.

In some embodiments, the reticle 500A includes a patterned absorption composite structure 350A1 positioned over the capping layer 210. The patterned absorption composite structure 350A1 includes the patterned absorption layer 212A1, the patterned etch stop layer 214A, the patterned absorption layer 212B1 and the patterned absorption layer 216A. In some embodiments, the patterned absorption layer 212A1 and the patterned absorption layer 212B1 are made of the same material (e.g., TaBN). In addition, the patterned etch stop layer 214A and the patterned absorption layer 216A may be made of the same material (e.g., TaBO). Therefore, the patterned absorption layer 212A1 and the patterned etch stop layer 214A may serve as a first absorption film pair. The patterned absorption layer 212B1 and the patterned absorption layer 216A may serve as a second absorption film pair positioned over the first absorption film pair. The patterned etch stop layer 214A may have different etching characteristics from the underlying patterned absorption layer 212A1 and the overlying patterned absorption layer 212B1. Each of the patterned absorption layer 212A1 and the patterned absorption layer 212B1 may have a reduced thickness. In addition, the first patterning process 360 used to form the patterned absorption layer 212A1 may have a more precisely control due to the underlying etch stop layer 214 shown in FIG. 1D. Furthermore, the second patterning process 362 used to form the patterned absorption layer 212B1 may have a more precisely control due to the reduced thickness of the absorption layer 212B. Therefore, the patterned etch stop layer 214A may protect the capping layer 210 and the underlying first reflective ML 206 from damage. The wafer neighboring effect (results from the damaged first reflective ML 206) may be reduced or eliminated. In addition, the etch stop layer 214 may serve as a signal sensing layer in a repairing/cleaning process of the patterned absorption layer 212A1 and the patterned absorption layer 212B1.

Because the patterned absorption layer 212A1 and the patterned absorption layer 212B1 each has a reduced thickness, the electrical conductivity of the absorption layer (e.g., the patterned absorption layer 212B1) positioned over the patterned etch stop layer 214A may be reduced. The induced static charges caused by the electrostatic force may be hard to accumulate on the front-side surface of the reticle. The electrostatic discharge damage and the particulate contamination (such as particles, powders, and organic matters) that adheres to the reticle due to the electric potential may be reduced. The quality of the reticle 500A may be improved.

FIGS. 2A-2D are cross-sectional views of various stages of a process for manufacturing a reticle 500B, in accordance with some embodiments. The materials, configurations, structures and/or processes of some elements of the reticle 500B may be similar to, or the same as, those of the corresponding elements (labeled in the same reference signs) of the reticle 500A, and the details thereof are not repeated herein. One of the differences between the reticle 500A and the reticle 500B is that a blank reticle 250B of the reticle 500B includes a second reflective multilayer (ML) 236 positioned between the absorption layer 212A and the etch stop layer 214.

Figure 2A:
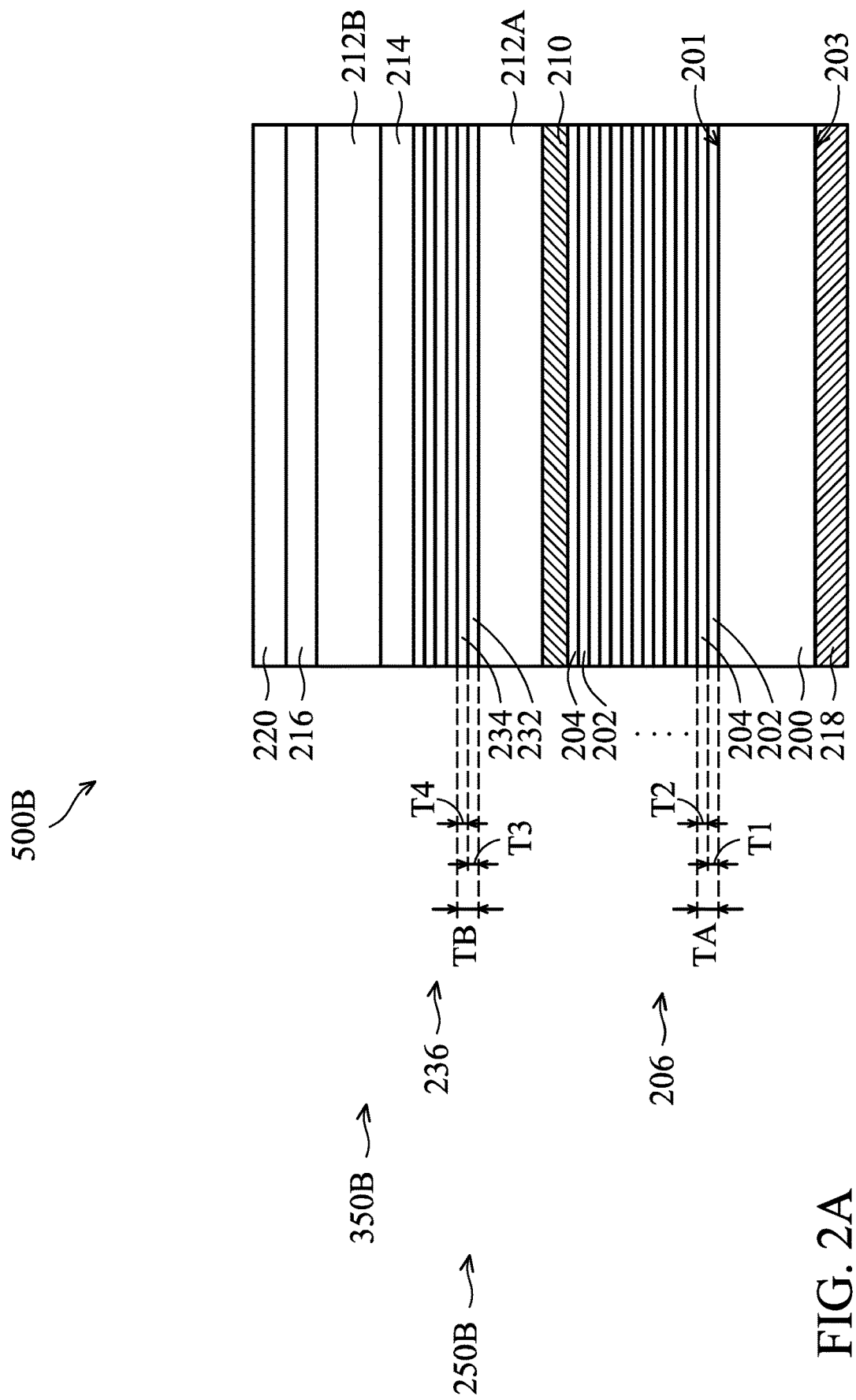
FIGS. 2A-2D are cross-sectional views of various stages of a process for manufacturing a reticle, in accordance with some embodiments.

As shown in FIG. 2A, the first reflective ML 206 may be formed over the front-side surface 201 of the mask substrate 200. The capping layer 210 may be formed over the first reflective ML 206. The absorption layer 212A may be formed over the capping layer 210. The materials, configurations, structures and/or processes of the mask substrate 200, the first reflective ML 206, the capping layer 210 and the absorption layer 212A of the blank reticle 250B may be similar to, or the same as, those of the mask substrate 200, the first reflective ML 206, the capping layer 210 and the absorption layer 212A of the blank reticle 250A, and the details thereof are not repeated herein.

Afterwards, the second reflective ML 236 is deposited over the absorption layer 212A, as shown in FIG. 2A in accordance with some embodiments. The materials, configurations, structures and/or processes of second reflective ML 236 may be similar to, those of the first reflective ML 206. The second reflective ML 236 may include a plurality of film pairs (e.g. a first layer 232 above or below a second layer 234 in each film pair), such as molybdenum-silicon (Mo/Si) or molybdenum-beryllium (Mo/Be) film pairs. In some embodiments, the number of film pairs in the second reflective ML 236 is less than the number of film pairs in the first reflective ML 206. For example, when the number of film pairs in the first reflective ML 206 is in a range from about twenty to about eighty, the number of film pairs in the second reflective ML 236 may be in a range from about two to about ten. In some embodiments, the number of film pairs in the second reflective ML 236 is in a range from about five to about ten. The formation of the second reflective ML 236 may help to improve the reflectivity effectively (e.g. the reflectivity may improve about 10% even when only 5 pairs of the second reflective ML 236 are formed).

In some embodiments, the ratio of the thickness TB of each of the film pairs in the second reflective ML 236 to the thickness TA of each of the film pairs in the first reflective ML 206 is equal to N/2, where N is a positive integer. For example, when the thickness TA is 7 nm, the thickness TB may be 3.5 nm (N=1), 7 nm (N=2), 10.5 nm (N=3), etc. In some embodiments, the ratio of the thickness T3 of the first layer 232 in the second reflective ML 236 to the thickness T1 of the first layer 202 in the first reflective ML 206 is equal to N/2, where N is a positive integer. For example, when the thickness T1 of the first layer 202 is 4 nm, the thickness T3 of the first layer 232 may be 2 nm (N=1), 4 nm (N=2), 6 nm (N=3), etc. In some embodiments, the ratio of the thickness T4 of the second layer 234 in the second reflective ML 236 to the thickness T2 of the second layer 204 in the first reflective ML 206 is equal to N/2, where N is a positive integer. For example, when the thickness T2 of the second layer 204 is 3 nm, the thickness T4 of the second layer 234 may be 1.5 nm (N=1), 3 nm (N=2), 4.5 nm (N=3), etc.

In some embodiments, the thickness T3 of the first layer 232 and the thickness T4 of the second layer 234 in the second reflective ML 236 can be adjusted to reduce the reflection of EUV light or change phase of the incident EUV light. Therefore, the reticle 500B including the second reflective ML 236 may be used as different kinds of EUV photomasks, such as binary intensity photomasks (BIM) and phase-shifting photomasks (PSM). For example, when the ratio of the thickness T3 to the thickness T1 and the ratio of the thickness T4 to the thickness T2 are equal to 0.5 or 1.5, the second reflective ML 236 can reduce the reflection of EUV light and reduce the neighboring effect of the wafer. For example, when ratio of the thickness T3 to the thickness T1 is equal to 1, the second reflective ML 236 can change phase (generally 180°) of the reflected EUV light between the absorption regions (the opaque regions 314B shown in FIG. 2D) and the reflective region (the reflective regions 316B shown in FIG. 2D) enhances the resolution and image quality of the reticle 500B.

Afterwards, the etch stop layer 214, the absorption layer 212B and the absorption layer 216 are deposited over the second reflective ML 236 in sequence, as shown in FIG. 2A in accordance with some embodiments. In some embodiments, the absorption layer 212A, the second reflective ML 236, the etch stop layer 214, the absorption layer 212B and the absorption layer 216 collectively serve as an absorption composite structure 350B. In some embodiments, the second reflective ML 236 is positioned between the absorption layer 212A and the etch stop layer 214.

After performing the aforementioned blank reticle fabrication processes, the blank reticle 250B is formed, as shown in FIG. 2A in accordance with some embodiments. In some embodiments, the blank reticle 250B includes the mask substrate 200, the first reflective ML 206, the capping layer 210 and the absorption composite structure 350B.

Afterwards, the hard mask layer 220 is formed over the absorption composite structure 350B of the blank reticle 250B, as shown in FIG. 2A in accordance with some embodiments.

Figure 2B:
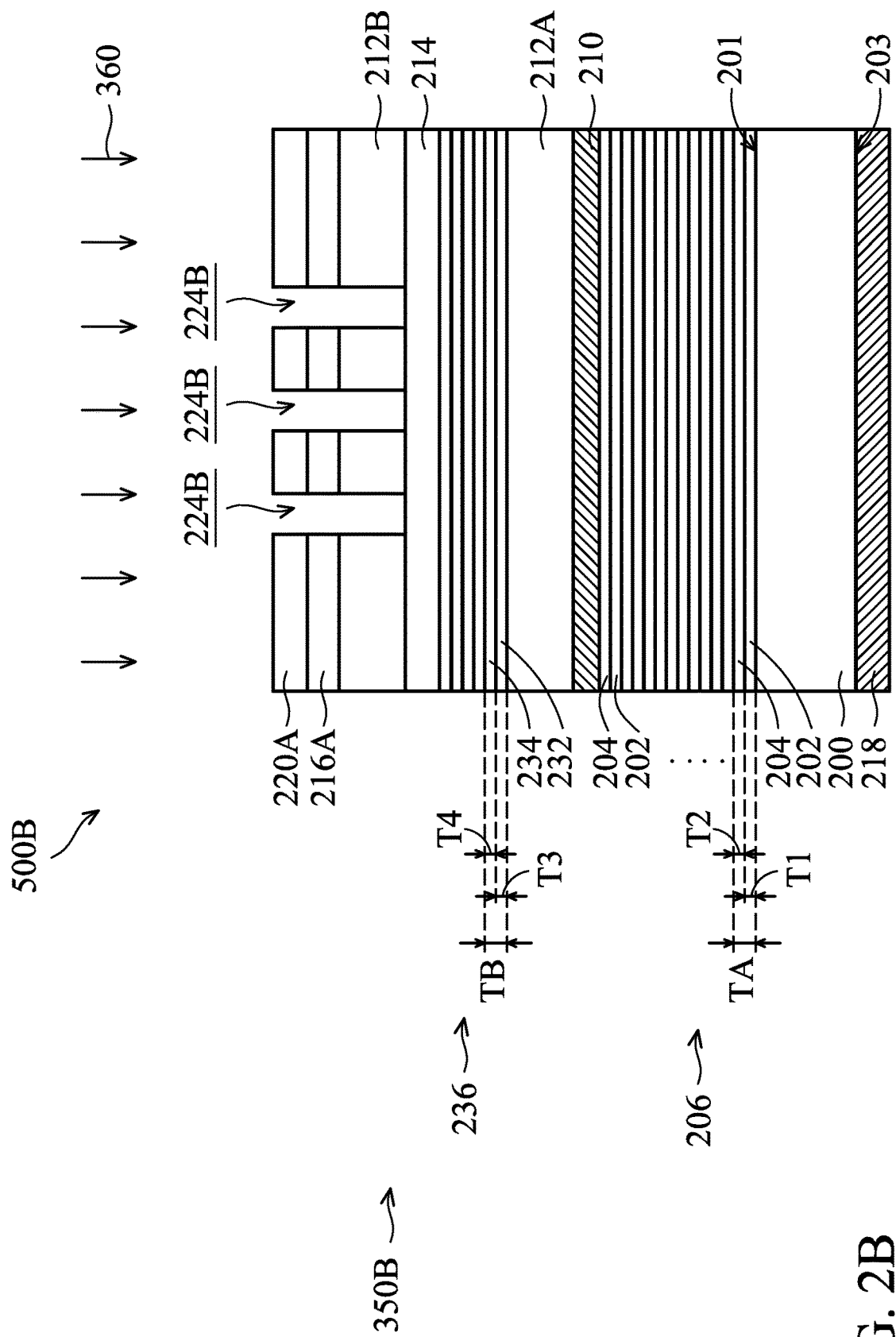

Afterwards, the processes shown in FIGS. 1B-1D are performed to form the hard mask patterns 220A, the patterned absorption layer 216A and the patterned absorption layer 212B1, as shown in FIG. 2B in accordance with some embodiments. In some embodiments, the first patterning process 360 may be performed to form openings 224B passing through the absorption layer 216 and the underlying absorption layer 212B (FIG. 2A) until the etch stop layer 214 is exposed.

Figure 2C:
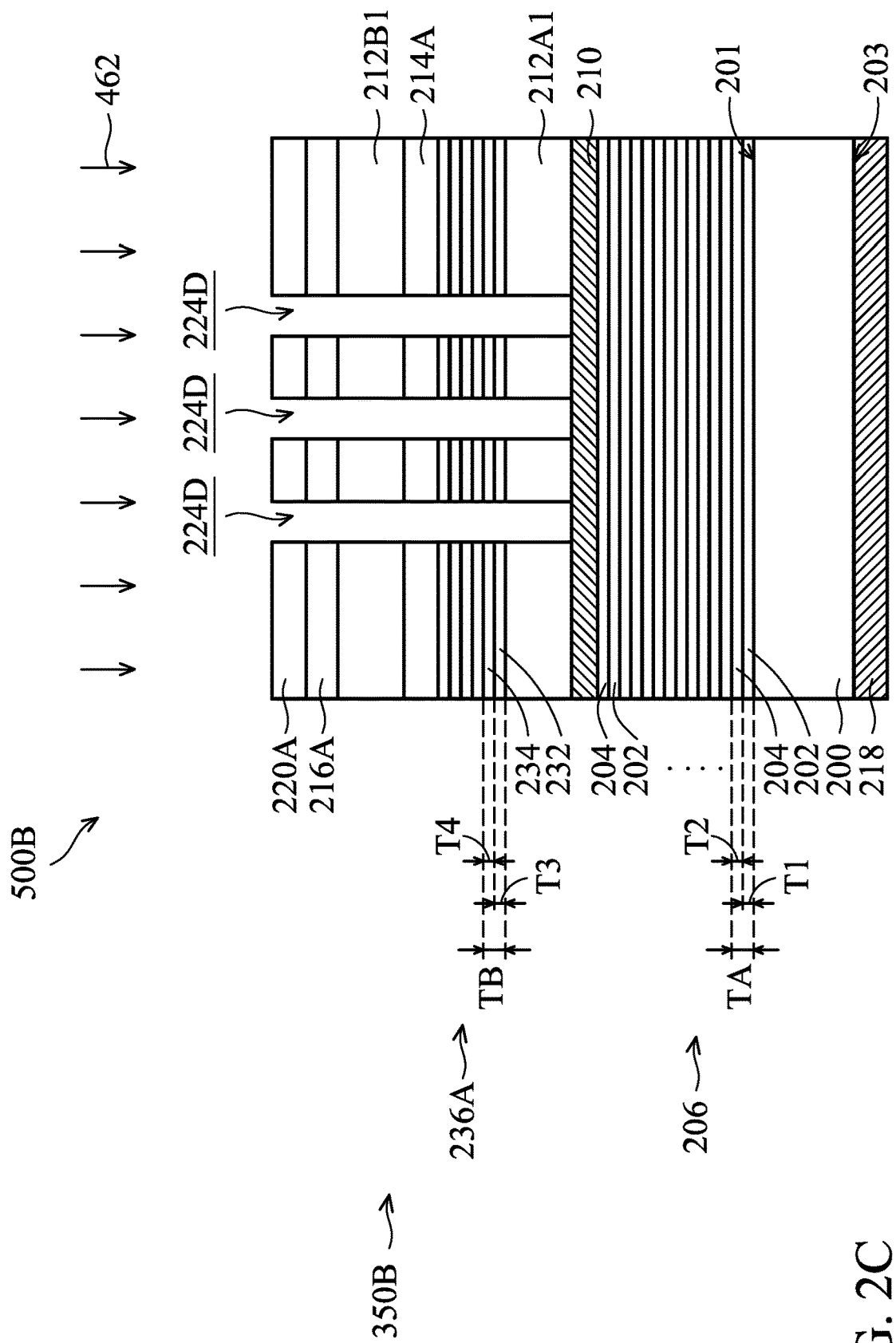

Afterwards, a second patterning process 462 is performed to remove portions of the etch stop layer 214, the second reflective ML 236 and the absorption layer 212A (FIG. 2B) until the capping layer 210 is exposed, as shown in FIG. 2C in accordance with some embodiments. The portions of the etch stop layer 214, the second reflective ML 236 and the absorption layer 212A that are not covered by the hard mask patterns 220A may be removed by the second patterning process 462. The second patterning process 462 may be performed to form openings 224D passing through the etch stop layer 214, the second reflective ML 236 and the underlying absorption layer 212A (FIG. 2B). In addition, the second patterning process 462 may stop on the capping layer 210 due to the etching selectivity between the absorption layer 212A and the capping layer 210. Therefore, the etch stop layer 214 is patterned to form a patterned etch stop layer 214A. The second reflective ML 236 is patterned to form a patterned second reflective ML 236A. The absorption layer 212A is patterned to form a patterned absorption layer 212A1 shown in FIG. 2C.

In some embodiments, the second patterning process 462 is similar to, or the same as, those of the second patterning process 362 shown in FIG. 1E, and the details thereof are not repeated herein.

Figure 2D:
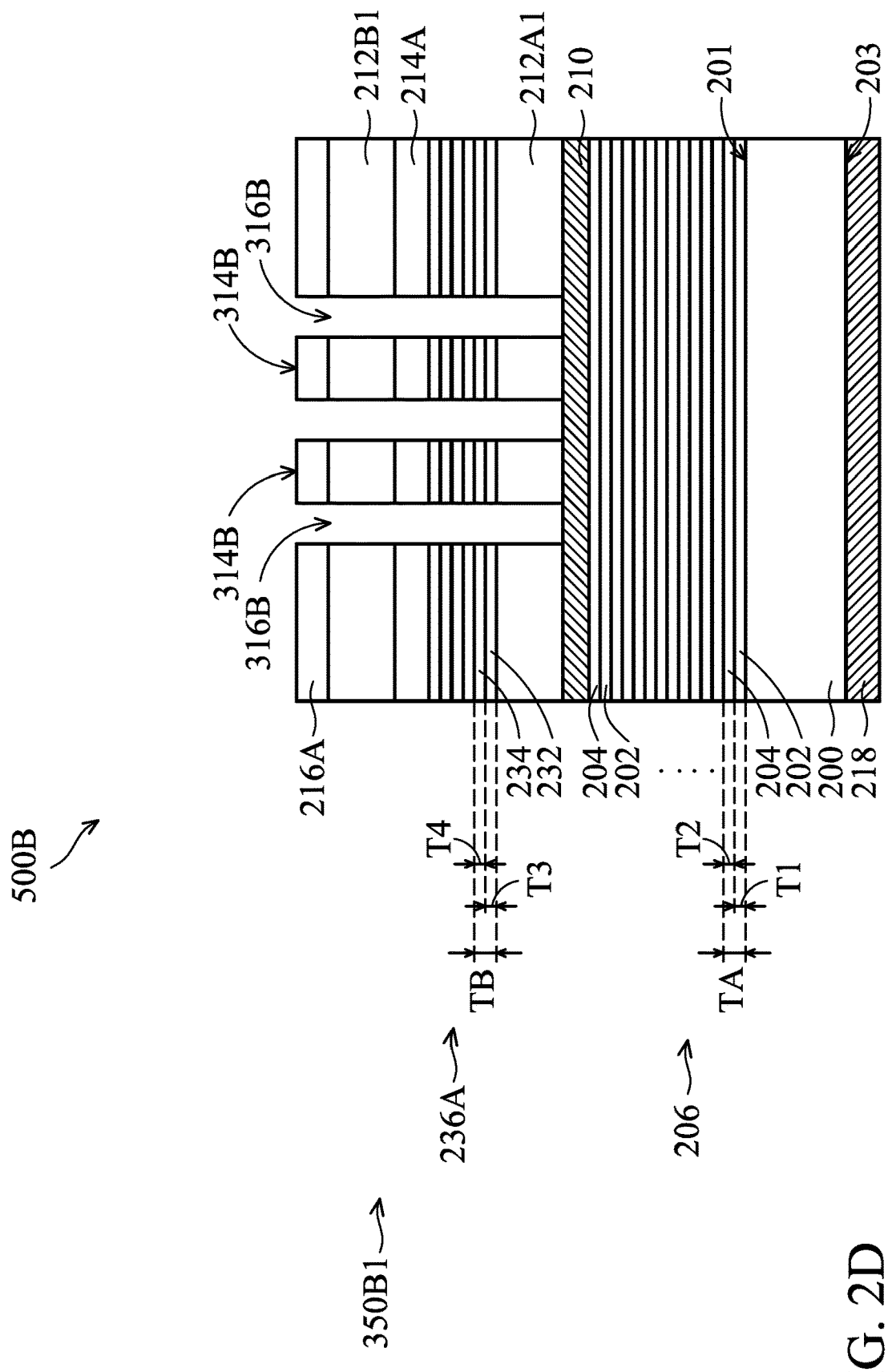

Afterwards, the hard mask patterns 220A are removed after performing the second patterning process 462 by an etching process, as shown in FIG. 2D in accordance with some embodiments. After hard mask patterns 220A are removed, the patterned absorption layer 212A1, the patterned second reflective ML 236A, the patterned etch stop layer 214A, the patterned absorption layer 212B1 and the patterned absorption layer 216A may collectively form a patterned absorption composite structure 350B1 on a portion of the capping layer 210. The etching process of the hard mask patterns 220A is described in some embodiments shown in FIG. 1F, and the details thereof are not repeated herein.

After performing the aforementioned processes, the reticle 500B is formed, as shown in FIG. 2D in accordance with some embodiments. For example, the reticle 500B may have opaque regions 314B and reflective regions 316B adjacent to the opaque regions 314B.

In some embodiments, the reticle 500B has advantages of the reticle 500A. In some embodiments, the reticle 500B includes the patterned second reflective ML 236A positioned between the patterned absorption layer 212A and the patterned etch stop layer 214A of the first absorption film pair (e.g., the patterned absorption layer 212A1 and the patterned etch stop layer 214A) of the patterned absorption composite structure 350B1. The thickness T3 of the first layer 232 and the thickness T4 of the second layer 234 in the patterned second reflective ML 236A can be adjusted to reduce the reflection of EUV light or change phase of the incident EUV light. Therefore, the reticle 500B may be used as binary intensity photomasks (BIM) and phase-shifting photomasks (PSM).

FIGS. 3A-3D are cross-sectional views of various stages of a process for manufacturing a reticle 500C, in accordance with some embodiments. The materials, configurations, structures and/or processes of some elements of the reticle 500C may be similar to, or the same as, those of the corresponding elements (labeled in the same reference signs) of the reticle 500A (or 500B), and the details thereof are not repeated herein. One of the differences between the reticle 500A and the reticle 500C is that a blank reticle 250C of the reticle 500C includes a third reflective multilayer (ML) 246 positioned between the etch stop layer 214 and the absorption layer 212B.

Figure 3A:
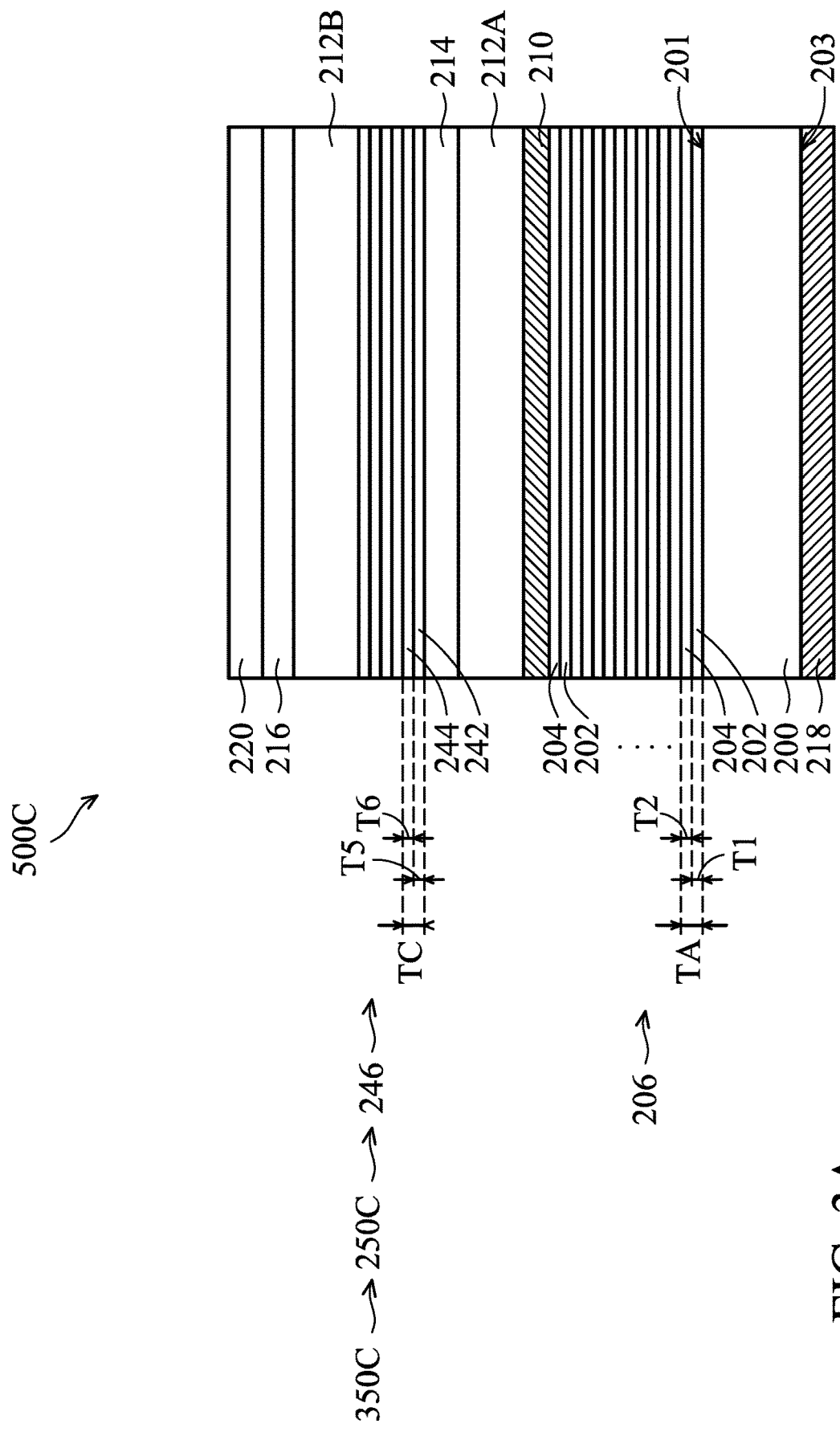
FIGS. 3A-3D are cross-sectional views of various stages of a process for manufacturing a reticle, in accordance with some embodiments.

As shown in FIG. 3A, the first reflective ML 206 may be formed over the front-side surface 201 of the mask substrate 200. The capping layer 210 may be formed over the first reflective ML 206. The absorption layer 212A may be formed over the capping layer 210. The etch stop layer 214 may be formed over the absorption layer 212A. The materials, configurations, structures and/or processes of the mask substrate 200, the first reflective ML 206, the capping layer 210, the absorption layer 212A and the etch stop layer 214 of the blank reticle 250C may be similar to, or the same as, those of the mask substrate 200, the first reflective ML 206, the capping layer 210, the absorption layer 212A and the etch stop layer 214 of the blank reticle 250A, and the details thereof are not repeated herein.

Afterwards, the third reflective ML 246 is deposited over the absorption layer 212A, as shown in FIG. 3A in accordance with some embodiments. The materials, configurations, structures and/or processes of third reflective ML 246 may be similar to, or the same as, those of the second reflective ML 236. The s third reflective ML 246 may include a plurality of film pairs (e.g. a first layer 242 above or below a second layer 244 in each film pair), such as molybdenum-silicon (Mo/Si) or molybdenum-beryllium (Mo/Be) film pairs. In some embodiments, the number of film pairs in the third reflective ML 246 is less than the number of film pairs in the first reflective ML 206. In addition the number of film pairs in the third reflective ML 246 may be equal to the number of film pairs in the second reflective ML 236. For example, when the number of film pairs in the first reflective ML 206 is in a range from about twenty to about eighty, the number of film pairs in the third reflective ML 246 may be in a range from about two to about ten.

In some embodiments, the ratio of the thickness TC of each of the film pairs in the third reflective ML 246 to the thickness TA of each of the film pairs in the first reflective ML 206 is equal to N/2, where N is a positive integer. In some embodiments, the ratio of the thickness TC of each of the film pairs in the third reflective ML 246 to the thickness TB of each of the film pairs in the second reflective ML 236 is equal to N/2, where N is a positive integer. For example, when the thickness TA (or TB) is 7 nm, the thickness TC may be 3.5 nm (N=1), 7 nm (N=2), 10.5 nm (N=3), etc. In some embodiments, the ratio of the thickness T5 of the first layer 242 in the third reflective ML 246 to the thickness T1 of the first layer 202 in the first reflective ML 206 (or the thickness T3 of the first layer 232 in the second reflective ML 236) is equal to N/2, where N is a positive integer. For example, when the thickness T1 of the first layer 202 (or the thickness T3 of the first layer 232) is 4 nm, the thickness T5 of the first layer 242 may be 2 nm (N=1), 4 nm (N=2), 6 nm (N=3), etc. In some embodiments, the ratio of the thickness T6 of the second layer 244 in the third reflective ML 246 to the thickness T2 of the second layer 204 in the first reflective ML 206 (or the thickness T4 of the second layer 234 in the second reflective ML 236) is equal to N/2, where N is a positive integer. For example, when the thickness T2 of the second layer 204 (or the thickness T4 of the second layer 234) is 3 nm, the thickness T6 of the second layer 244 may be 1.5 nm (N=1), 3 nm (N=2), 4.5 nm (N=3), etc.

In some embodiments, the thickness T5 of the first layer 242 and the thickness T6 of the second layer 244 in the third reflective ML 246 can be adjusted to reduce the reflection of EUV light or change phase of the incident EUV light. Therefore, the reticle 500C including the third reflective ML 246 may be used as different kinds of EUV photomasks, such as binary intensity photomasks (BIM) and phase-shifting photomasks (PSM). For example, when the ratio of the thickness T5 to the thickness T1 and the ratio of the thickness T6 to the thickness T2 are equal to 1 or 1.5, the third reflective ML 246 can reduce the reflection of EUV light. For example, when ratio of the thickness T5 to the thickness T1 equal to 0.5, the third reflective ML 246 can change phase (generally 180°) of the reflected EUV light between the absorption regions (the opaque regions 314C shown in FIG. 3D) and the reflective region (the reflective regions 316C shown in FIG. 3D) enhances the resolution and image quality of the reticle 500C.

Afterwards, the absorption layer 212B and the absorption layer 216 are deposited over the third reflective ML 246 in sequence, as shown in FIG. 3A in accordance with some embodiments. In some embodiments, the absorption layer 212A, the etch stop layer 214, the third reflective ML 246, the absorption layer 212B and the absorption layer 216 collectively serve as an absorption composite structure 350C. In some embodiments, the third reflective ML 246 is positioned between the etch stop layer 214 and the absorption layer 212B.

After performing the aforementioned blank reticle fabrication processes, the blank reticle 250C is formed, as shown in FIG. 3A in accordance with some embodiments. In some embodiments, the blank reticle 250C includes the mask substrate 200, the first reflective ML 206, the capping layer 210 and the absorption composite structure 350C.

Afterwards, the hard mask layer 220 is formed over the absorption composite structure 350C of the blank reticle 250C, as shown in FIG. 3A in accordance with some embodiments.

Figure 3B:
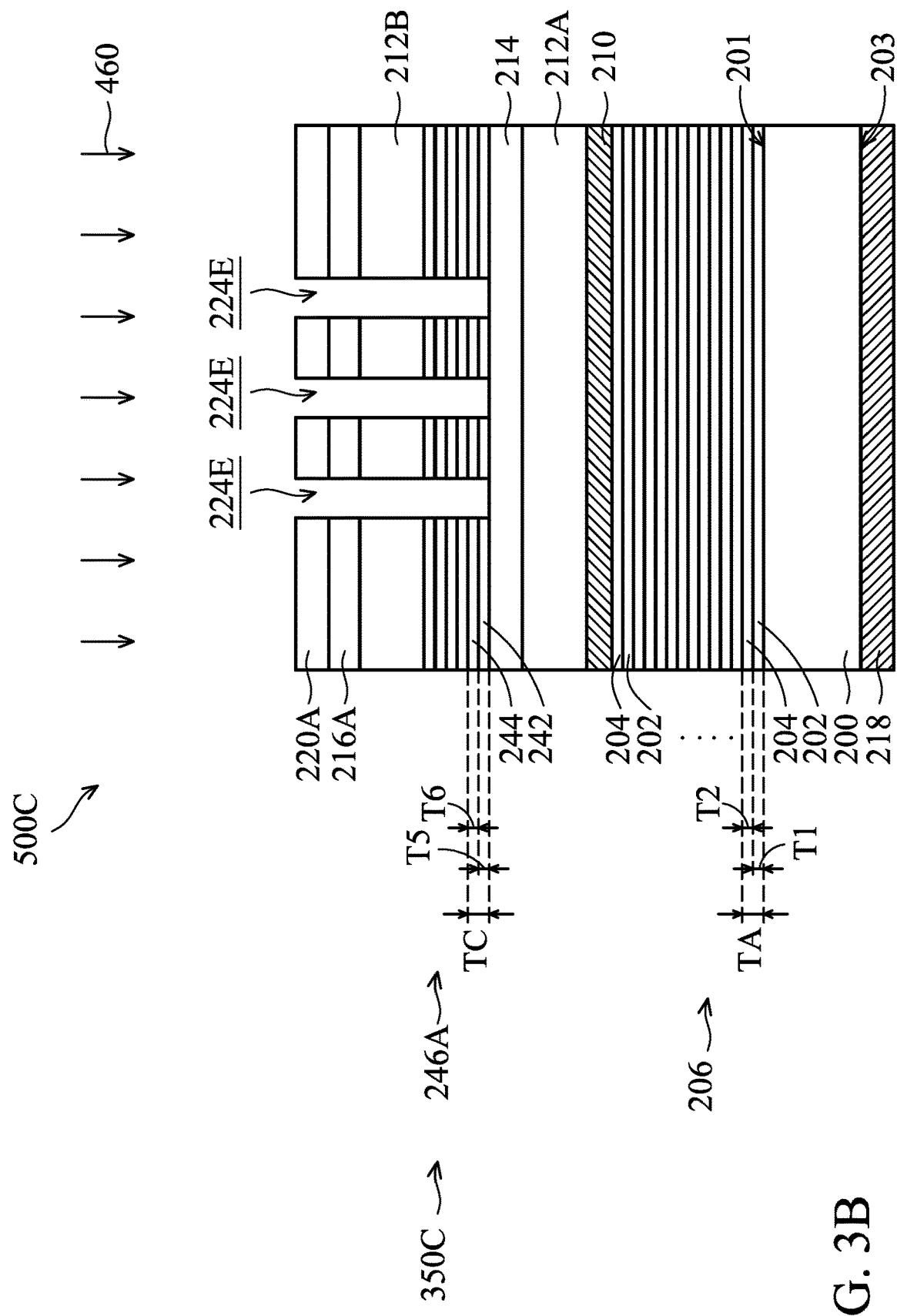

Afterwards, the processes shown in FIGS. 1B-1C are performed to form the hard mask patterns 220A over the absorption layer 216 (FIG. 3A), as shown in FIG. 3B in accordance with some embodiments. Afterwards, a first patterning process 460 is performed to form openings 224E passing through the absorption layer 216, the absorption layer 212B and the third reflective ML 246 (FIG. 3A) until the etch stop layer 214 is exposed. Therefore, the absorption layer 216 is patterned to form a patterned absorption layer 216A. The absorption layer 212B is patterned to form a patterned absorption layer 212B1. The third reflective ML 246 is patterned to form a patterned third reflective ML 246A shown in FIG. 3B.

In some embodiments, the first patterning process 460 is similar to, or the same as, those of the first patterning process 360 shown in FIG. 1D, and the details thereof are not repeated herein.

Figure 3C:
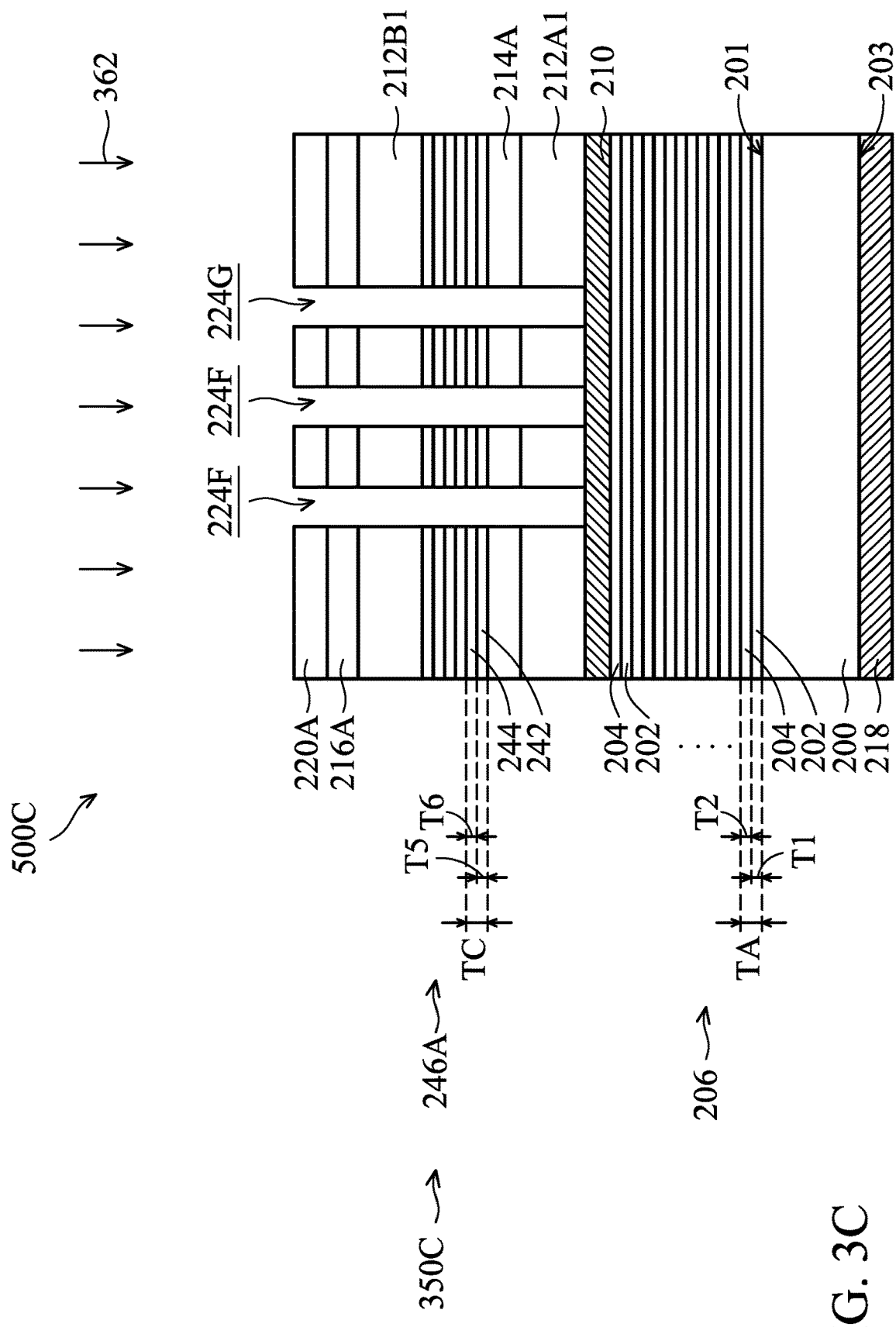

Afterwards, the second patterning process 362 is performed to remove portions of the etch stop layer 214, and the absorption layer 212A (FIG. 3B) until the capping layer 210 is exposed, as shown in FIG. 3C in accordance with some embodiments. The second patterning process 362 may be performed to form openings 224F passing through the etch stop layer 214 and the underlying absorption layer 212A (FIG. 3B). Therefore, the etch stop layer 214 is patterned to form a patterned etch stop layer 214A. The absorption layer 212A is patterned to form a patterned absorption layer 212A1 shown in FIG. 3C.

Figure 3D:
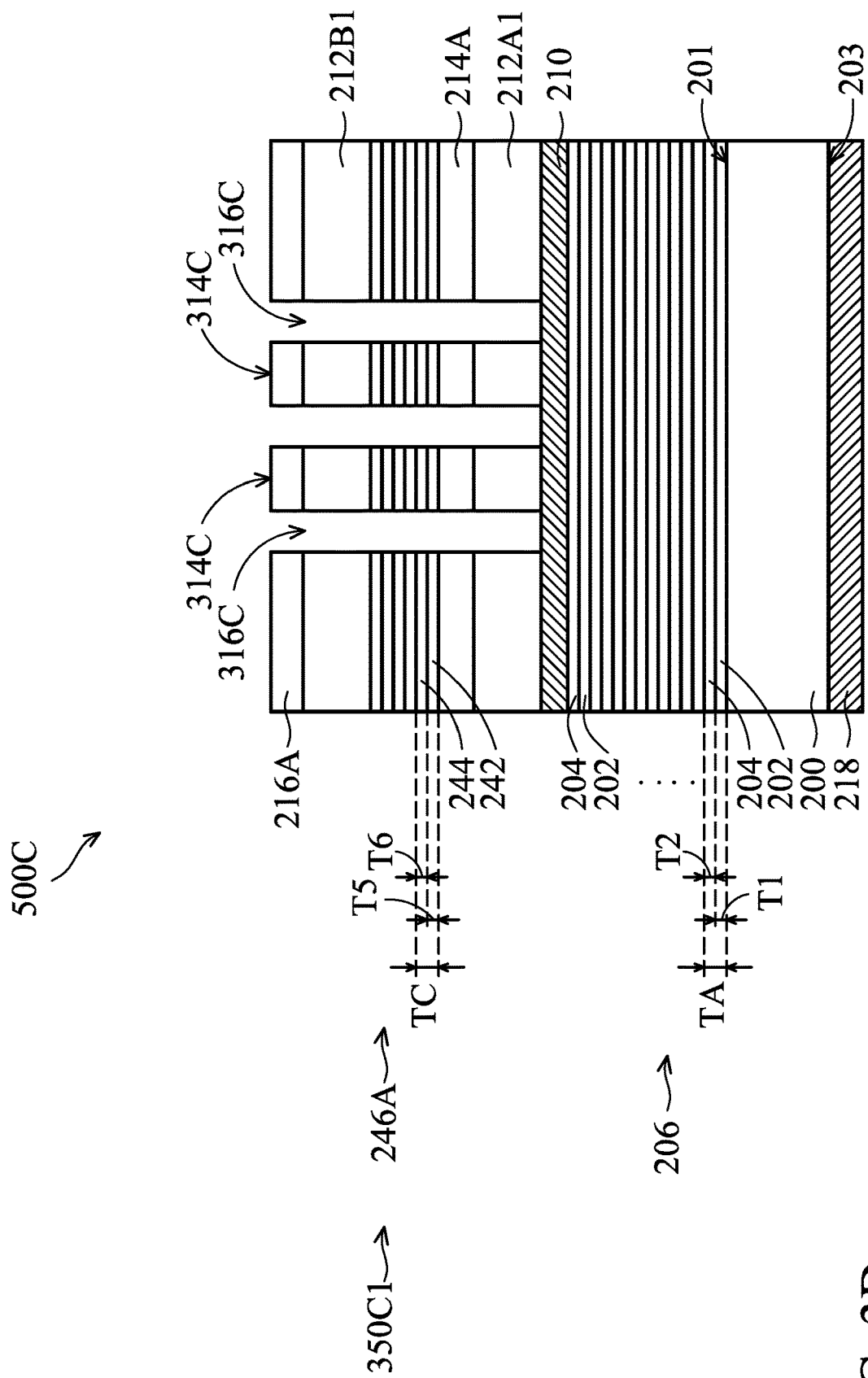

Afterwards, the hard mask patterns 220A are removed after performing the second patterning process 362 by an etching process, as shown in FIG. 3D in accordance with some embodiments. After hard mask patterns 220A are removed, the patterned absorption layer 212A1, the patterned etch stop layer 214A, the patterned third reflective ML 246A, the patterned absorption layer 212B1 and the patterned absorption layer 216A may collectively form a patterned absorption composite structure 350C1 on a portion of the capping layer 210. The etching process of the hard mask patterns 220A is described in some embodiments shown in FIG. 1F, and the details thereof are not repeated herein.

After performing the aforementioned processes, the reticle 500C is formed, as shown in FIG. 3D in accordance with some embodiments. For example, the reticle 500C may have opaque regions 314C and reflective regions 316C adjacent to the opaque regions 314C.

In some embodiments, the advantages of the reticle 500C are similar to, or the same as, those of the reticle 500C. In some embodiments, the reticle 500B includes the patterned third reflective ML 246A positioned between the first absorption film pair (e.g., the patterned absorption layer 212A1 and the patterned etch stop layer 214A) and the second absorption film pair (e.g., the patterned absorption layer 212B1 and the patterned absorption layer 216A) of the patterned absorption composite structure 350C1. The thickness T5 of the first layer 242 and the thickness T6 of the second layer 244 in the patterned third reflective ML 246A can be adjusted to reduce the reflection of EUV light or change phase of the incident EUV light. Therefore, the reticle 500C may be used as binary intensity photomasks (BIM) and phase-shifting photomasks (PSM).

FIGS. 4A-4D are cross-sectional views of various stages of a process for manufacturing a reticle 500D, in accordance with some embodiments. The materials, configurations, structures and/or processes of some elements of the reticle 500D may be similar to, or the same as, those of the corresponding elements (labeled in the same reference signs) of the reticles 500A, 500B and 500C, and the details thereof are not repeated herein. One of the differences between the reticle 500A and the reticle 500D is that a blank reticle 250D of the reticle 500D includes the second reflective multilayer (ML) 236 and the third reflective multilayer (ML) 246. The second reflective multilayer (ML) 236 may be positioned between the absorption layer 212A and the etch stop layer 214. The third reflective multilayer (ML) 246 may be positioned between the etch stop layer 214 and the second absorption layer 212B.

Figure 4A:
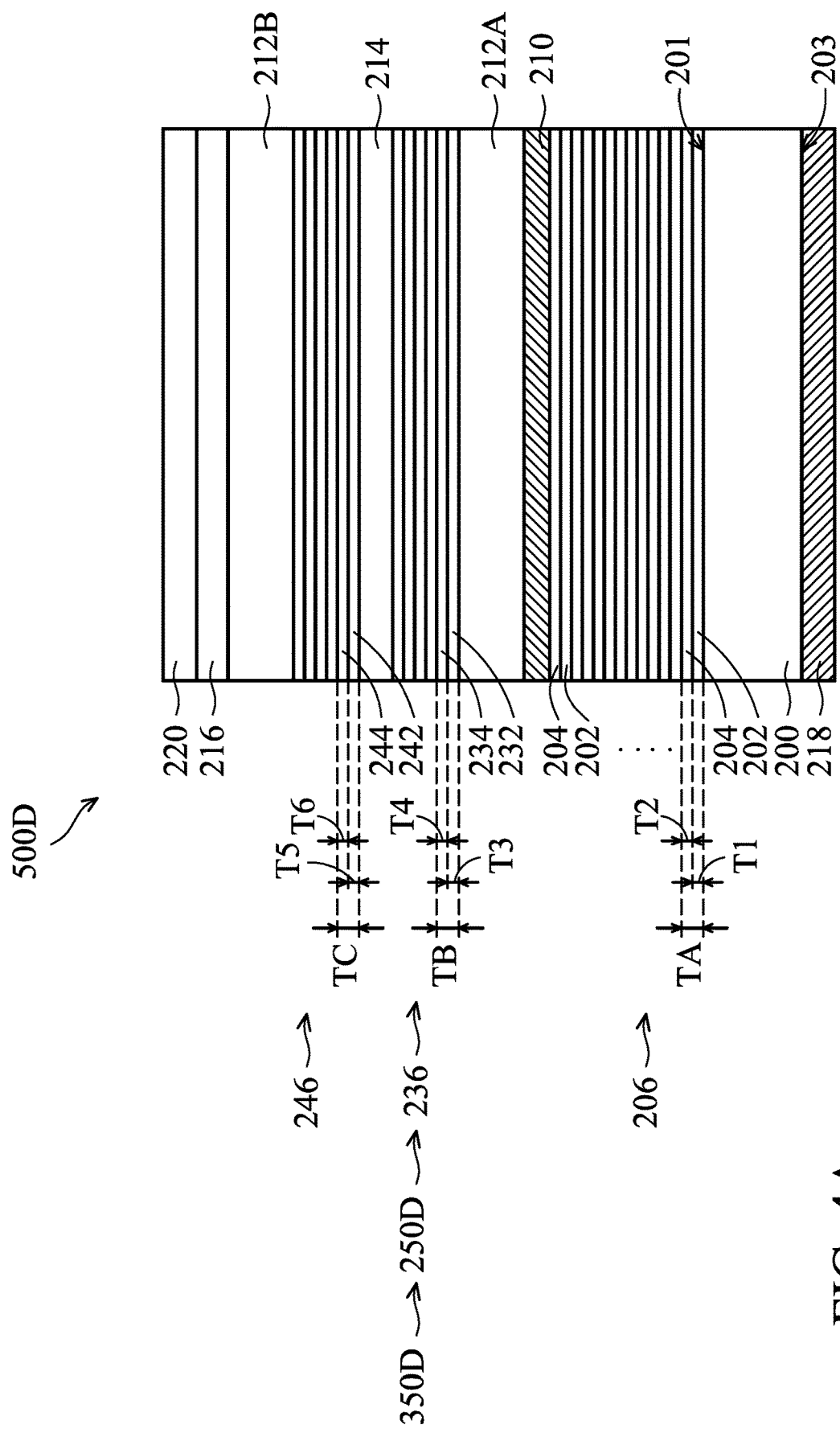
FIGS. 4A-4D are cross-sectional views of various stages of a process for manufacturing a reticle, in accordance with some embodiments.

As shown in FIG. 4A, the first reflective ML 206 may be formed over the front-side surface 201 of the mask substrate 200. The capping layer 210 may be formed over the first reflective ML 206. The absorption layer 212A, the second reflective ML 236, the etch stop layer 214, the third reflective ML 246, the absorption layer 212B and the absorption layer 216 are deposited over the capping layer 210 in sequence, as shown in FIG. 4A in accordance with some embodiments. In some embodiments, the absorption layer 212A, the second reflective ML 236, the etch stop layer 214, the third reflective ML 246, the absorption layer 212B and the absorption layer 216 collectively serve as an absorption composite structure 350D.

The materials, configurations, structures and/or processes of the mask substrate 200, the first reflective ML 206, the capping layer 210, the absorption layer 212A, the second reflective ML 236, the etch stop layer 214, the third reflective ML 246, the absorption layer 212B and the absorption layer 216 of the blank reticle 250D may be similar to, or the same as, those of the mask substrate 200, the first reflective ML 206, the capping layer 210, the absorption layer 212A, the second reflective ML 236, the etch stop layer 214, the third reflective ML 246, the absorption layer 212B and the absorption layer 216 in the blank reticles 250A, 250B and 250C, and the details thereof are not repeated herein.

After performing the aforementioned blank reticle fabrication processes, the blank reticle 250D is formed, as shown in FIG. 4A in accordance with some embodiments. In some embodiments, the blank reticle 250D includes the mask substrate 200, the first reflective ML 206, the capping layer 210 and the absorption composite structure 350D.

Afterwards, the hard mask layer 220 is formed over the absorption composite structure 350D of the blank reticle 250D, as shown in FIG. 4A in accordance with some embodiments.

Figure 4B:
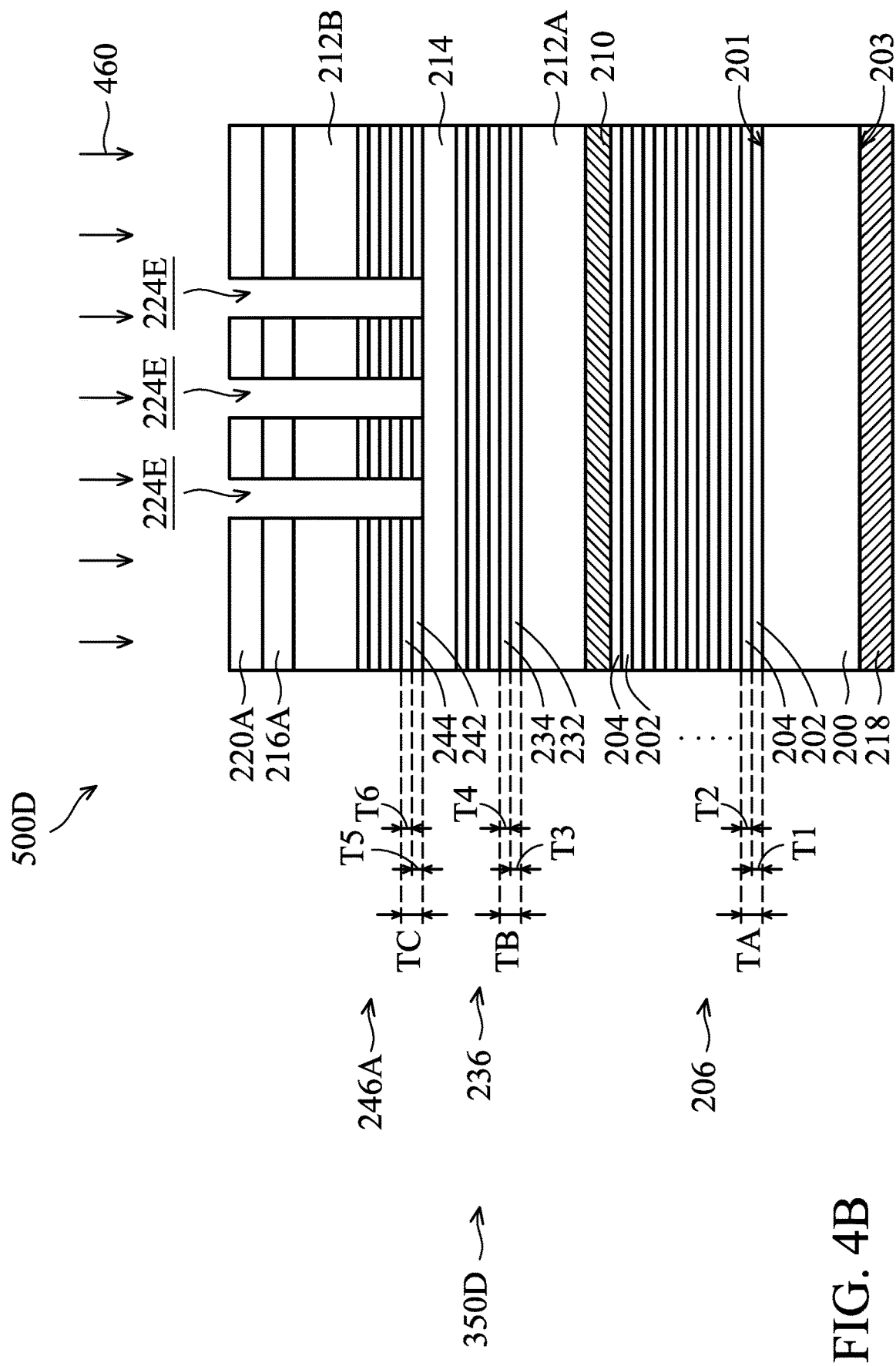

Afterwards, the processes shown in FIGS. 1B-1C are performed to form the hard mask patterns 220A over the absorption layer 216 (FIG. 4A), as shown in FIG. 4B in accordance with some embodiments. Afterwards, the first patterning process 460 is performed to form the openings 224E passing through the absorption layer 216, the absorption layer 212B and the third reflective ML 246 (FIG. 4A) until the etch stop layer 214 is exposed. Therefore, the absorption layer 216 is patterned to form a patterned absorption layer 216A. The absorption layer 212B is patterned to form a patterned absorption layer 212B1. The third reflective ML 246 is patterned to form a patterned third reflective ML 246A shown in FIG. 4B.

Figure 4C:
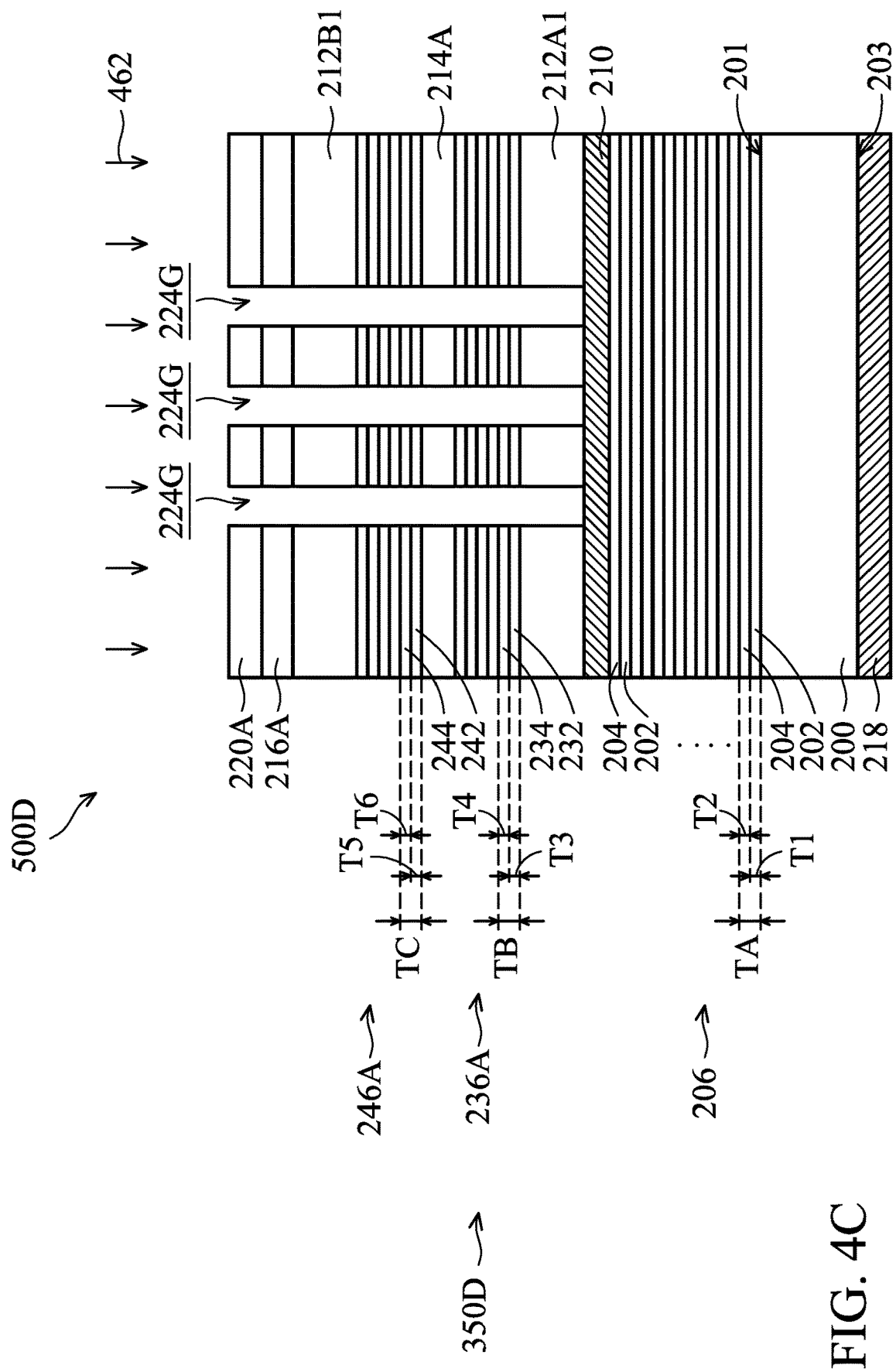

Afterwards, the second patterning process 462 is performed to form openings 224G passing through the etch stop layer 214, the second reflective ML 236 and the absorption layer 212A (FIG. 4B) until the capping layer 210 is exposed, as shown in FIG. 4C in accordance with some embodiments. Therefore, the etch stop layer 214 is patterned to form a patterned etch stop layer 214A. The second reflective ML 236 is patterned to form a patterned second reflective ML 236A. The absorption layer 212A is patterned to form a patterned absorption layer 212A1 shown in FIG. 4C.

Figure 4D:
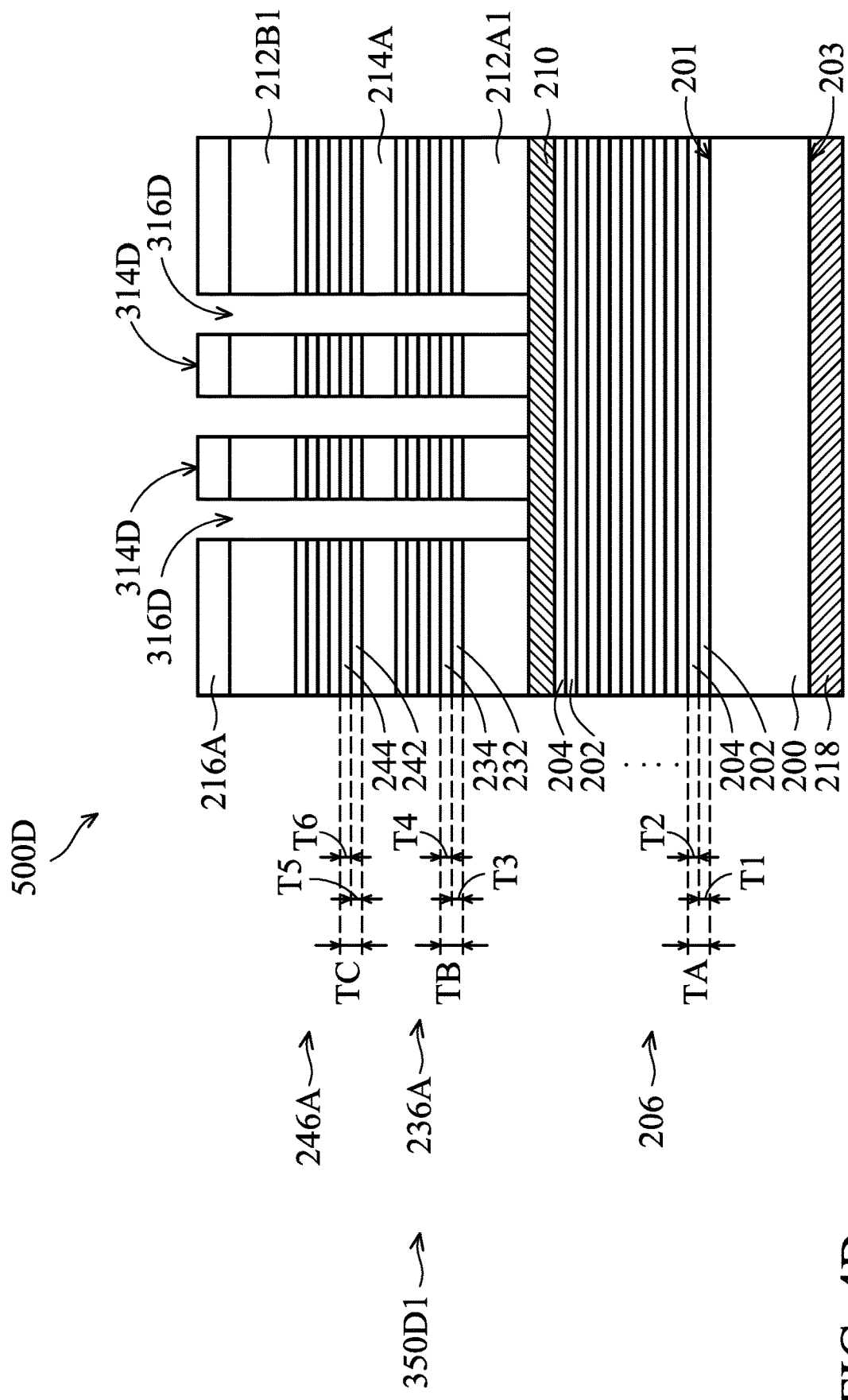

Afterwards, the hard mask patterns 220A are removed after performing the second patterning process 462 by an etching process, as shown in FIG. 4D in accordance with some embodiments. After hard mask patterns 220A are removed, the patterned absorption layer 212A1, the patterned second reflective ML 236A, the patterned etch stop layer 214A, the patterned third reflective ML 246A, the patterned absorption layer 212B1 and the patterned absorption layer 216A may collectively form a patterned absorption composite structure 350D1 on a portion of the capping layer 210.

After performing the aforementioned processes, the reticle 500D including opaque regions 314D and reflective regions 316D is formed, as shown in FIG. 4D in accordance with some embodiments.

In some embodiments, the advantages of the reticle 500D are similar to, or the same as, those of the reticles 500B and 500C. In some embodiments, the ratio of the thickness TB of each of the film pairs in the second reflective ML 236 (or the thickness TC of each of the film pairs in the third reflective ML 246) to the thickness TA of each of the film pairs in the first reflective ML 206 is equal to N/2, where N is a positive integer. In some embodiments, the ratio of the thickness TC of each of the film pairs in the third reflective ML 246 to the thickness TB of each of the film pairs in the second reflective ML 236 is equal to N/2, where N is a positive integer. The thicknesses of the first layers and the second layers in the patterned second reflective ML 236A and the patterned third reflective ML 246A can be adjusted to reduce the reflection of EUV light or change phase of the incident EUV light. Therefore, the reticle 500D may be used as binary intensity photomasks (BIM) and phase-shifting photomasks (PSM).

Figure 5:
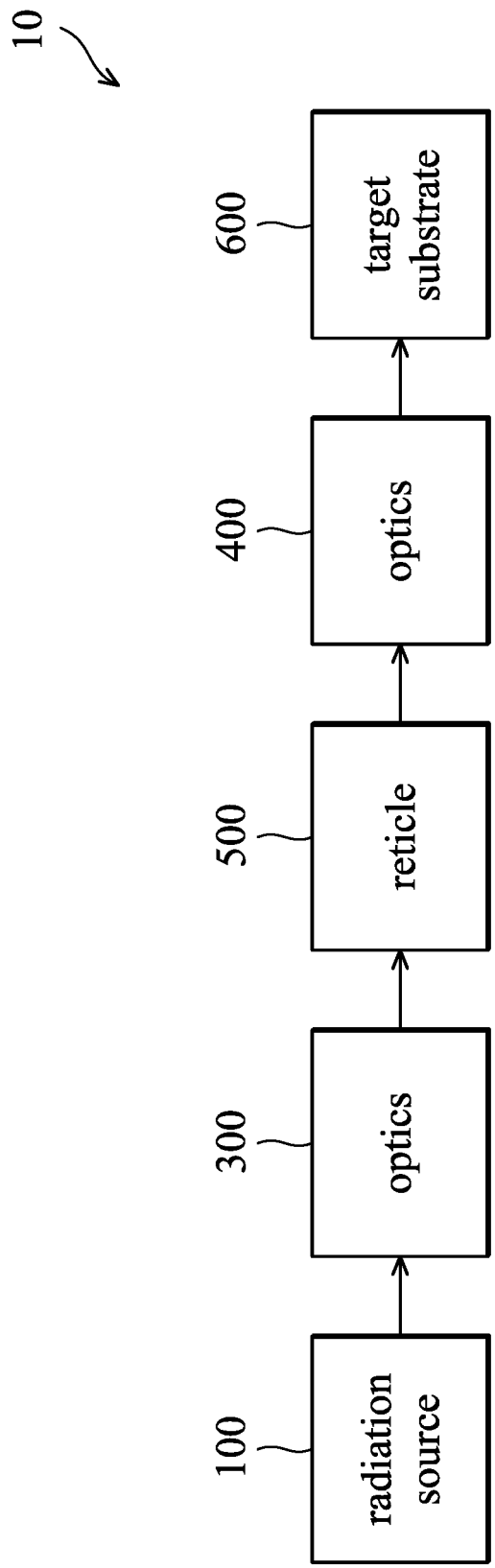
FIG. 5 is a block diagram of a EUV lithography system using a reticle in accordance with some embodiments.

The reticle (e.g., the reticles 500A, 500B, 500C and 500D) described above may be used in an EUV process for forming a semiconductor structure. FIG. 5 is a block diagram of a EUV lithography system 10 using a reticle in accordance with some embodiments.

The EUV lithography system 10 includes a radiation source 100, optics 300, a reticle 500, optics 400, and a target substrate 600, as shown in FIG. 5 in accordance with some embodiments.

During the lithography process, the radiation source 100 may provide a radiation to the optics 300, and the optics 300 may guide the radiation applied from the radiation source 100 to the reticle 500. Then, the radiation may be reflected from the reticle 500 to form a patterned radiation beam, and the patterned radiation beam may be collected by the optics 400. Finally, the optics 400 may direct the patterned radiation beam to the target substrate 600 to form a pattern on the target substrate.

In some embodiments, the radiation source 100 is a radiation source which provides electromagnetic radiation having a wavelength in the EUV range. In some embodiments, the optics 300 are illumination optics. In some embodiments, the optics 400 are projection optics. The reticle 500 may be one of the reticles 500A to 500D described above and the details of the reticle 500 are not repeated herein.

In some embodiments, the target substrate 600 is a semiconductor substrate, such as a semiconductor wafer. In some embodiments, the target substrate 600 includes a photosensitive layer (e.g. a photoresist layer), which is sensitive to the EUV radiation, and the photosensitive layer is patterned during the EUV process. The patterned photosensitive layer may then be used as a mask to pattern a material layer below it. For example, the photosensitive layer may be used in an etching process or an implanting process.

As described previously, the reticle (e.g., the reticles 500A, 500B, 500C and 500D) includes an absorption composite structure (e.g., the patterned absorption composite structures 350A1, 350B1 and 350C1) including a first composite absorption layer (e.g., an absorption composite layer composed by the patterned absorption layers 212A and 212B), a second absorption layer and an etch stop layer (e.g., the patterned etch stop layer 214A). The first composite absorption layer is formed of a first absorption material (e.g., TaBN), and the second absorption layer (e.g., the patterned absorption layer 216A) may be formed of a second absorption material (e.g., TaBO) that is different form the first absorption material. In some embodiments, the absorption composite structure of the reticle includes an etch stop layer (e.g., the patterned etch stop layer 214A) dividing the first composite absorption layer with a thick thickness into two individual absorption layers (e.g., the patterned absorption layers 212A1 and 212B1) each has a thinner thickness. Therefore, the first composite absorption layer may be patterned by a two-step patterning process (e.g., the first patterning processes 360 and 460 and the second patterning processes 362 and 462). In addition, the two-step patterning process may have a more precisely control due to the reduced thickness of the two individual absorption layers. Therefore, the etch stop layer may protect the capping layer 210 and the underlying first reflective ML 206 from damage. The wafer neighboring effect (results from the damaged first reflective ML 206) may be reduced or eliminated. In addition, the etch stop layer may serve as a signal sensing layer in a repairing/cleaning process of the two individual absorption layers formed of the first absorption material (e.g., TaBN).

Because the two individual absorption layers each has a reduced thickness, the electrical conductivity of the absorption layer (e.g., the patterned absorption layer 212B1) positioned over the etch stop layer may be reduced. The induced static charges may be hard to accumulate on the front-side surface of the reticle. The electrostatic discharge damage and the particulate contamination may be reduced. The quality of the reticle 500 may be improved.

As described previously, the reticle (e.g., the reticles 500B, 500C and 500D) includes at least one additional reflective ML (e.g., the patterned second reflective ML 236A and the patterned third reflective ML 246A). For example, the additional reflective ML may be positioned between the absorption layer formed (e.g., the patterned absorption layer 212A) and the etch stop layer (e.g., the patterned etch stop layer 214A) of the first absorption film pair of the patterned absorption composite structure (e.g., the patterned absorption composite structures 350B1, 350C1 and 350D1). For example, the additional reflective ML may be positioned between the first absorption film pair (e.g., the patterned absorption layer 212A1 and the patterned etch stop layer 214A) and the second absorption film pair (e.g., the patterned absorption layer 212B1 and the patterned absorption layer 216A) of the patterned absorption composite structure (e.g., the patterned absorption composite structures 350B1, 350C1 and 350D1). The thicknesses of the first layers and the second layers in the additional reflective ML can be adjusted to reduce the reflection of EUV light or change phase of the incident EUV light. Therefore, the reticle may be used as binary intensity photomasks (BIM) and phase-shifting photomasks (PSM).

Embodiments of a reticle and a method for manufacturing the same are provided. The reticle includes an absorption composite structure (e.g., the patterned absorption composite structures 350A1, 350B1, 350C1 and 350D1) positioned over the capping layer 210. The absorption composite structure includes a first absorption layer (e.g., the patterned absorption layer 212A1) and a second absorption layer (e.g., the patterned absorption layer 212B1) made of the same material. The absorption composite structure includes an etch stop layer (e.g., the patterned etch stop layer 214A) positioned between the first absorption layer and the second absorption layer. The etch stop layer may protect the capping layer 210 and the underlying first reflective ML 206 from damage.

In some embodiments, a reticle is provided. The reticle includes a mask substrate, a reflective multilayer (ML), a capping layer and an absorption composite structure. The mask substrate has a front-side surface and a back-side surface. The reflective ML is positioned over the front-side surface of the mask substrate. The capping layer is positioned over the reflective ML. The absorption composite structure is positioned over the capping layer. The reflective composite structure includes a first absorption layer, a second absorption layer, a third absorption layer and an etch stop layer. The first absorption layer is positioned over the capping layer. The second absorption layer is positioned over the first absorption layer. The third absorption layer is positioned over the second absorption layer. The etch stop layer is positioned between the first absorption layer and the second absorption layer. The first absorption layer and the second absorption layer are made of the same material.

In some embodiments, a reticle is provided. The reticle includes a mask substrate, a reflective multilayer (ML), a capping layer and an absorption composite structure. The mask substrate has a front-side surface and a back-side surface. The reflective ML is positioned over the front-side surface of the mask substrate. The capping layer is positioned over the reflective ML. The absorption composite structure is positioned over the capping layer. The reflective composite structure includes a first absorption film pair over the capping layer and a second absorption film pair over the first absorption film pair. The first absorption film pair and the second absorption film pair each comprises a first absorption layer and a second absorption layer over the first absorption layer. The first absorption layer and the second absorption layer are made of different materials.

In some embodiments, a method for manufacturing a reticle is provided. The method includes forming a first reflective multilayer (ML) over a front-side surface of a mask substrate. The method includes forming a capping layer over the first reflective ML. The method further includes depositing a first absorption layer formed of a first material over the capping layer. The method further includes depositing an etch stop layer over the first absorption layer. The method further includes forming a second absorption layer using the first material over the etch stop layer. The method further includes performing a first patterning process to remove portions of the second absorption layer until the etch stop layer is exposed. The method further includes performing a second patterning process to remove portions of the etch stop layer and the first absorption layer until the capping layer is exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reticle, comprising:
 a mask substrate having a front-side surface and a back-side surface;
 a first reflective multilayer (ML) over the front-side surface of the mask substrate;
 a capping layer over the first reflective ML; and
 an absorption composite structure over the capping layer, wherein the absorption composite structure comprises:
 a first absorption layer over the capping layer;
 a second absorption layer over the first absorption layer;
 a third absorption layer over the second absorption layer;
 an etch stop layer between the first absorption layer and the second absorption layer, wherein the first absorption layer and the second absorption layer are made of the same material; and
 a second reflective multilayer (ML) between the first absorption layer and the etch stop layer, wherein the first reflective ML comprises a first number of film pairs, and the second reflective ML comprises a second number of film pairs, and the second number of film pairs is less than the first number of film pairs.

2. The reticle as claimed in claim 1, wherein the etch stop layer and the third absorption layer are made of the same material.

3. The reticle as claimed in claim 1, wherein the first absorption layer and the etch stop layer are made of different materials.

4. The reticle as claimed in claim 1, wherein the etch stop layer comprises tantalum, aluminum, ruthenium, nickel, chromium, an oxide thereof, a nitride thereof, a boride thereof, or a combination thereof.

5. The reticle as claimed in claim 1, wherein the ratio of the thickness of each of the film pairs in the second reflective ML to the thickness of each of the film pairs in the first reflective ML is equal to N/2, where N is a positive integer.

6. The reticle as claimed in claim 1, wherein the absorption composite structure comprises:
a third reflective multilayer (ML) between the etch stop layer and the second absorption layer.

7. The reticle as claimed in claim 6, wherein the third reflective ML comprises a third number of film pairs, wherein the second number of film pairs is equal to the third number of film pairs.

8. The reticle as claimed in claim 7, wherein the ratio of the thickness of each of the film pairs in the third reflective ML to the thickness of each of the film pairs in the second reflective ML is equal to N/2, where N is a positive integer.

9. The reticle as claimed in claim 6, wherein the third reflective ML comprises a third number of film pairs, wherein the third number of film pairs is less than the first number of film pairs.

10. The reticle as claimed in claim 1, wherein the thickness of each of the film pairs in the second reflective ML is half of the thickness of each of the film pairs in the first reflective ML.

11. A reticle, comprising:
a mask substrate having a front-side surface and a back-side surface;
a first reflective multilayer (ML) over the front-side surface of the mask substrate;
a capping layer over the first reflective ML;
an absorption composite structure over the capping layer, wherein the absorption composite structure comprises:
a first absorption film pair over the capping layer, wherein the first absorption film pair comprises a first absorption layer and a second absorption layer over the first absorption layer, wherein the first absorption layer and the second absorption layer are made of different materials; and
a second absorption film pair over the first absorption film pair, wherein the second absorption film pair comprises a third absorption layer and a fourth absorption layer over the third absorption layer, wherein the third absorption layer and the fourth absorption layer are made of different materials;
a conductive layer over the back-side surface of the mask substrate; and
a second reflective multilayer (ML) between the first absorption layer and the second absorption layer of the first absorption film pair, wherein the first reflective ML comprises a first number of film pairs, and the second reflective ML comprises a second number of film pairs, and the second number of film pairs is less than the first number of film pairs.

12. The reticle as claimed in claim 11,
wherein the ratio of the thickness of each of the film pairs in the second reflective ML to the thickness of each of the film pairs in the first reflective ML is equal to N/2, where N is a positive integer.

13. The reticle structure as claimed in claim 12, wherein the absorption composite structure comprises:
a third reflective multilayer (ML) between the first absorption film pair and the second absorption film pair, wherein the ratio of the thickness of each of the film pairs in the third reflective ML to the thickness of each of the film pairs in the first reflective ML is equal to N/2, where N is a positive integer.

14. The reticle as claimed in claim 11, wherein the conductive layer comprises tantalum boron (TaB) or chromium nitride (CrN).

15. The reticle as claimed in claim 11, wherein the thickness of each layer of each of the film pairs in the second reflective ML is less than the thickness of each layer of each of the film pairs in the first reflective ML.

16. The reticle as claimed in claim 11, wherein the thickness of each layer of each of the film pairs in the second reflective ML is greater than the thickness of each layer of each of the film pairs in the first reflective ML.

17. A method for manufacturing a reticle, comprising:
forming a first reflective multilayer (ML) over a front-side surface of a mask substrate;
forming a capping layer over the first reflective ML;
depositing a first absorption layer formed of a first material over the capping layer;
forming a second reflective ML over the first absorption layer;
depositing an etch stop layer over the second reflective ML;
forming a third reflective ML over the etch stop layer;
forming a second absorption layer using the first material over the third reflective ML;
performing a first patterning process to remove portions of the second absorption layer and the third reflective ML until the etch stop layer is exposed; and
performing a second patterning process to remove portions of the etch stop layer, the second reflective ML and the first absorption layer until the capping layer is exposed.

18. The method for manufacturing a reticle as claimed in claim 17, further comprising:
forming a third absorption layer using a second material over the second absorption layer;
forming a hard mask layer over the third absorption layer; and
forming a photoresist pattern over a portion of the hard mask layer before performing the first patterning process.

19. The method for manufacturing a reticle as claimed in claim 18, further comprising:
removing the photoresist pattern after performing the second patterning process.

20. The method for manufacturing a reticle as claimed in claim 17, wherein the first reflective ML and the second reflective ML each comprises a plurality of film pairs, and the thickness of each of the film pairs in the second reflective ML is double of the thickness of each of the film pairs in the first reflective ML.

* * * * *